US012771092B2

(12) United States Patent
Enomoto et al.

(10) Patent No.: US 12,771,092 B2
(45) Date of Patent: Oct. 20, 2026

(54) PLURALITY OF LIGHT-EMITTING DEVICES, AND LIGHT-EMITTING MODULE

(71) Applicant: NICHIA CORPORATION, Anan (JP)

(72) Inventors: Kiyoshi Enomoto, Tokushima (JP); Eiichiro Okahisa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 610 days.

(21) Appl. No.: 18/356,092

(22) Filed: Jul. 20, 2023

(65) Prior Publication Data

US 2024/0030676 A1 Jan. 25, 2024

(30) Foreign Application Priority Data

Jul. 25, 2022 (JP) ................................ 2022-117705
Feb. 21, 2023 (JP) ................................ 2023-025092

(51) Int. Cl.
*H01S 5/02253* (2021.01)
*H01S 5/40* (2006.01)

(52) U.S. Cl.
CPC ........ *H01S 5/02253* (2021.01); *H01S 5/4093* (2013.01)

(58) Field of Classification Search
CPC ...... H01S 5/02253; H01S 5/4093; H01S 5/02; H01S 5/02208; H01S 5/02255; H01S 5/06825; H01S 5/4025
See application file for complete search history.

(56) References Cited

U.S. PATENT DOCUMENTS

| | | | | |
|---|---|---|---|---|
| 2012/0133900 | A1 | 5/2012 | Miura | |
| 2014/0285773 | A1 | 9/2014 | Miura | |
| 2016/0301899 | A1 | 10/2016 | Miura | |
| 2017/0317467 | A1* | 11/2017 | Miura | H01S 5/4031 |
| 2017/0332058 | A1 | 11/2017 | Miura | |
| 2019/0103723 | A1* | 4/2019 | Miura | H01S 5/0225 |
| 2019/0121141 | A1* | 4/2019 | Dykaar | H01S 5/4075 |
| 2019/0371971 | A1* | 12/2019 | Kozuru | H01S 5/02208 |
| 2020/0185877 | A1 | 6/2020 | Kawaguchi et al. | |
| 2020/0194974 | A1* | 6/2020 | Kozuru | G03B 21/2033 |
| 2020/0381900 | A1 | 12/2020 | Hashimoto | |

(Continued)

FOREIGN PATENT DOCUMENTS

| | | |
|---|---|---|
| JP | 2012-073496 A | 4/2012 |
| JP | 2012-113223 A | 6/2012 |

(Continued)

*Primary Examiner* — Xinning(Tom) Niu
(74) *Attorney, Agent, or Firm* — Spencer Fane LLP

(57) ABSTRACT

A plurality of light emitting devices include first and second light-emitting devices. The first light-emitting device includes: a first package, first semiconductor laser elements sealed in the first package, and a first lens member having lens surfaces. The second light-emitting device includes a second package having a same outer shape as the first package, one or more second semiconductor laser elements sealed in the second package, and a second lens member having one or more lens surfaces. The first semiconductor laser elements include a semiconductor laser element to emit first light having a color different from light emitted from any of the second semiconductor laser elements. A curvature of the lens surface of the first lens member to transmit the first light is the same as a curvature of one of the lens surfaces of the second lens member.

11 Claims, 11 Drawing Sheets

(56) References Cited

U.S. PATENT DOCUMENTS

| | | | |
|---|---|---|---|
| 2021/0083451 | A1 | 3/2021 | Hashimoto |
| 2022/0329038 | A1 | 10/2022 | Hashimoto |

FOREIGN PATENT DOCUMENTS

| | | | |
|---|---|---|---|
| JP | 2020-095939 | A | 6/2020 |
| JP | 2020-194916 | A | 12/2020 |
| JP | 2021-044501 | A | 3/2021 |
| WO | 2018003156 | A1 | 1/2018 |

* cited by examiner

PLURALITY OF LIGHT-EMITTING DEVICES, AND LIGHT-EMITTING MODULE

CROSS-REFERENCE TO RELATED APPLICATIONS

This application claims priority to Japanese Patent Application No. 2022-117705, filed on Jul. 25, 2022, and Japanese Patent Application No. 2023-025092, filed on Feb. 21, 2023, the entire disclosures of which are hereby incorporated herein by reference.

BACKGROUND

The present invention relates to light-emitting devices in a plurality of forms, and to a light-emitting module.

JP 2020-95939 A discloses a light-emitting module in which a first light-emitting device and a second light-emitting device are mounted on a single wiring substrate. The first light-emitting device and the second light-emitting device include a different quantity of laser elements mounted on packages having the same shape. JP 2020-95939 A also discloses that it is possible to provide the light-emitting module that flexibly meets a demand for a necessary quantity of laser elements to be mounted.

SUMMARY

One or more customers may have requests for various variations of laser elements to be mounted in a light-emitting module or a light-emitting device, not only for the quantities of laser elements to be mounted.

On the other hand, in recent years, awareness of environmental considerations has also increased in the manufacture of products. For example, some companies are taking measures to optimize inventory management to suppress unnecessary loss and to suppress excessive environmental load.

In addition to the known perspective of performance improvement, there is also a demand for technical ideas in the manufacture of products to incorporate the viewpoint of environmental load. In order to provide a product in response to a plurality of demands also, it is desirable to manufacture the product while suppressing the load on the environment.

According to one embodiment, a plurality of light-emitting devices is adapted to be transferred to one customer or transferred separately to different customers. The plurality of light-emitting devices includes a first light-emitting device and a second light-emitting device. The first light-emitting device includes a first package having a first outer shape, a plurality of first semiconductor laser elements sealed in the first package, and a first lens member fixed to the first package and having a plurality of lens surfaces, a number of the lens surfaces of the first lens member being the same as the number of the first semiconductor laser elements, each of the lens surfaces corresponding to a respective one of the first semiconductor laser elements and being configured to transmit light emitted from the respective one of the first semiconductor laser elements. The second light-emitting device includes a second package having the first outer shape, one or more second semiconductor laser elements sealed in the second package, and a second lens member fixed to the second package and having one or more lens surfaces, a number of the one or more lens surfaces of the second lens member being the same as the number of the one or more second semiconductor laser elements, each of the one or more lens surfaces corresponding to a respective one of the one or more second semiconductor laser elements and being configured to transmit light emitted from the respective one of the one or more second semiconductor laser elements. A number of the one or more second semiconductor laser elements is less than a number of the first semiconductor laser elements. One of the first semiconductor laser elements is configured to emit first light having a color different from a color of light emitted from any of the one or more second semiconductor laser elements. A curvature of one of the lens surfaces of the first lens member configured to transmit the first light emitted from the one of the first semiconductor laser elements is the same as a curvature of one of the one or more lens surfaces of the second lens member.

According to one embodiment, a light-emitting module includes a first light-emitting device, a second light-emitting device, and a wiring substrate. The first light-emitting device includes a first package having a first outer shape, a plurality of first semiconductor laser elements sealed in the first package, and a first lens member fixed to the first package and having a plurality of lens surfaces, a number of the lens surfaces of the first lens member being the same as the number of the first semiconductor laser elements, each of the lens surfaces corresponding to a respective one of the first semiconductor laser elements and being configured to transmit light emitted from the respective one of the first semiconductor laser elements. The second light-emitting device includes a second package having the first outer shape, one or more second semiconductor laser elements sealed in the second package, and a second lens member fixed to the second package and having one or more lens surfaces, a number of the one or more lens surfaces of the second lens member being the same as the number of the one or more second semiconductor laser elements, each of the one or more lens surfaces corresponding to a respective one of the one or more second semiconductor laser elements and being configured to transmit light emitted from the respective one of the one or more second semiconductor laser elements. The first light-emitting device and the second light-emitting device are mounted on the wiring substrate. A number of the one or more second semiconductor laser elements is less than a number of the first semiconductor laser elements. One of the first semiconductor laser elements is configured to emit light of a color different from a color of light emitted from any of the one or more second semiconductor laser elements. A curvature of one of the lens surfaces of the first lens member configured to transmit the light emitted from the one of the first semiconductor laser elements is the same as a curvature of one of the one or more lens surfaces of the second lens member.

DETAILED DESCRIPTION

Figure 1:
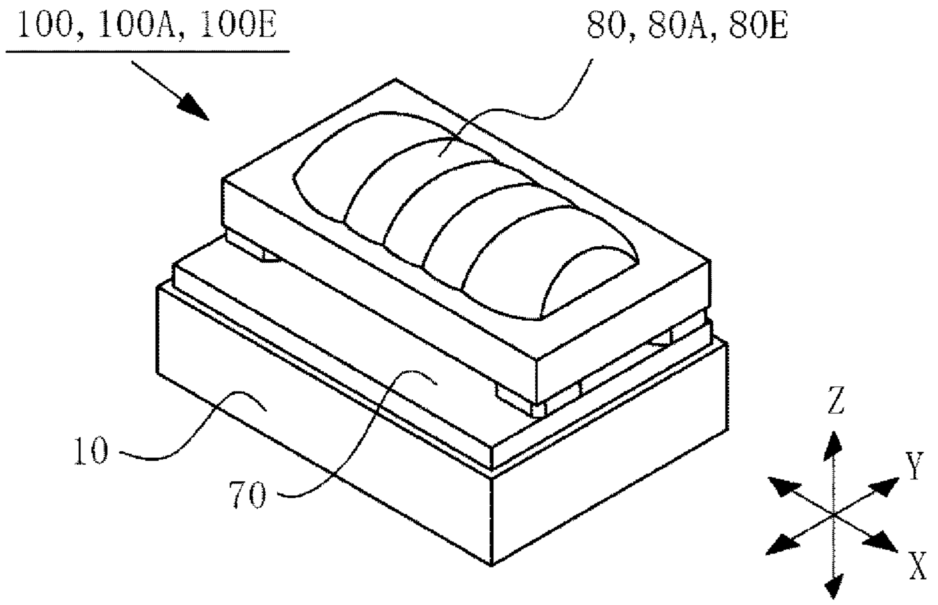
FIG. 1 is a schematic perspective view of a first light-emitting device and a fifth light-emitting device according to an embodiment.

In the present specification and claims, the term "polygonal shape", such as a triangle, quadrangle, or the like, includes shapes with modifications such as rounded, beveled, angled, or reverse-rounded corners. Similarly, not only shapes with such modifications at corners (ends of sides) but also shapes with modifications at intermediate portions of sides will be similarly referred to as polygonal shapes. In other words, a polygon-based shape with a partial modification is included in the term "polygonal shape" disclosed in the present specification and the claims.

The same applies not only to polygons but also to terms representing specific shapes such as trapezoids, circles, protrusions, and recesses. The same applies when describing each side forming that shape. That is, even if an end or an intermediate portion of a side is modified, the modified portion is interpreted as a portion of the "side." When "polygonal shapes" and "sides" without such modification are to be distinguished from those with modifications, the term "in a strict sense" may be added, and may be referred to as terms such as "a quadrangular shape in a strict sense."

In the specification and the claims, descriptions such as upper and lower (upward/downward), left and right, top and bottom, front and back (forward/backward), near and far, and the like are used merely to describe the relative relationship of positions, orientations, directions, and the like, and the expressions need not correspond to an actual relationship at the time of use.

In the drawings, directions such as an X direction, a Y direction, and a Z direction may be indicated by using arrows. The directions of the arrows are the same across multiple drawings of the same embodiment. In addition, in the drawings, the directions of the arrows marked with X, Y, and Z indicate respective positive directions, and directions opposite to these directions indicate respective negative directions. For example, the direction marked with "X" at the tip of the arrow indicates the X direction and the positive direction. The direction which is the X direction and the positive direction may be referred to as the +X direction and the opposite direction may be referred to as the −X direction. The same applies to the Y direction and Z direction.

Terms "member", "portion", etc., may be used when, for example, a component and the like are described in this specification. The term "member" refers to an object to be treated as a physically single component. The object to be treated as a physically single component can also be an object treated as a single component in a manufacturing process. On the other hand, the term "portion" refers to an object that need not be treated as a physically single component. For example, the term "portion" is used when a portion of a single member is partially regarded.

The distinction between "member" and "portion" described above does not indicate an intention to limit the scope of rights in interpretation of the doctrine of equivalents. In other words, even when there is a component described as "member" in the claims, this does not mean that the applicant recognizes that treating the component as a physically single component is essential in the application of the present invention.

In the specification and the claims, when there are a plurality of components and each of these components is to be indicated separately, the components may be distinguished by adding the terms "first" and "second" before the name of the component. Objects to be distinguished may differ between the specification and the claims. Thus, there may be a case in which, although a component in the claims is given the same term as that in the specification, the object indicated by that component is not the same between the specification and the claims.

For example, when there are components distinguished by using "first", "second", and "third" in the specification, and when components given the terms "first" and "third" in the specification are described in the claims, these components may be distinguished by being denoted as "first" and "second" in the claims for ease of understanding. In this case, the components denoted as "first" and "second" in the claims refer to the components termed "first" and "third" in the specification, respectively. Such denotations is not limited to components and may also apply to other objects in a reasonable and flexible manner.

Certain embodiments of the present invention will be described below. Furthermore, specific embodiments of the present invention will be described below with reference to the drawings. Embodiments of the present invention are not limited to the specific embodiments to be described below. In other words, the illustrated embodiments are not an only form in which the present invention is realized. Sizes, positional relationships, and the like of members illustrated in the drawings may be exaggerated in order to facilitate understanding.

Embodiment

Figure 2:
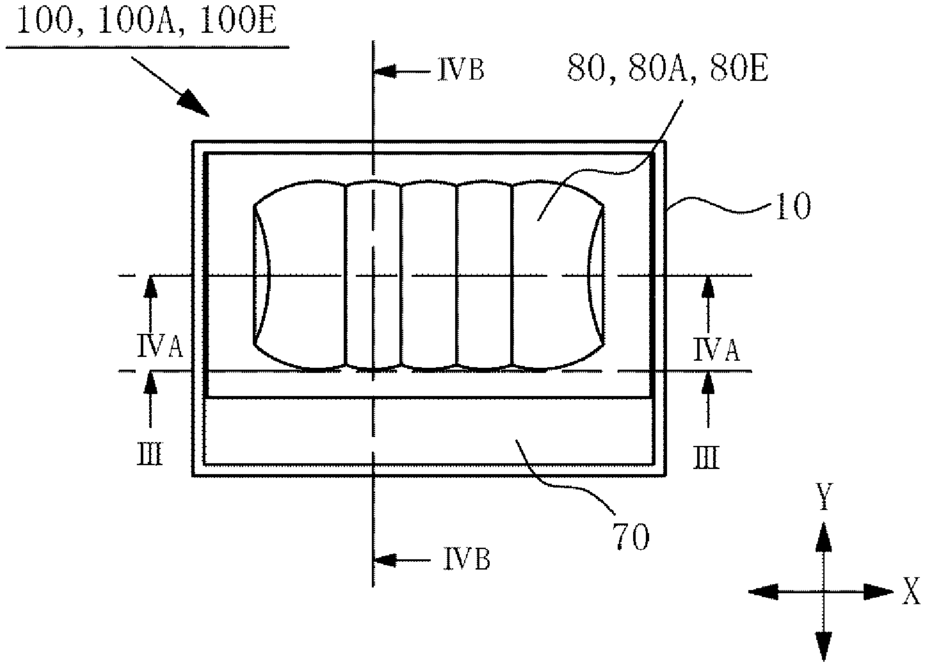
FIG. 2 is a schematic top view of the first light-emitting device and the fifth light-emitting device according to the embodiment.
Figure 3:
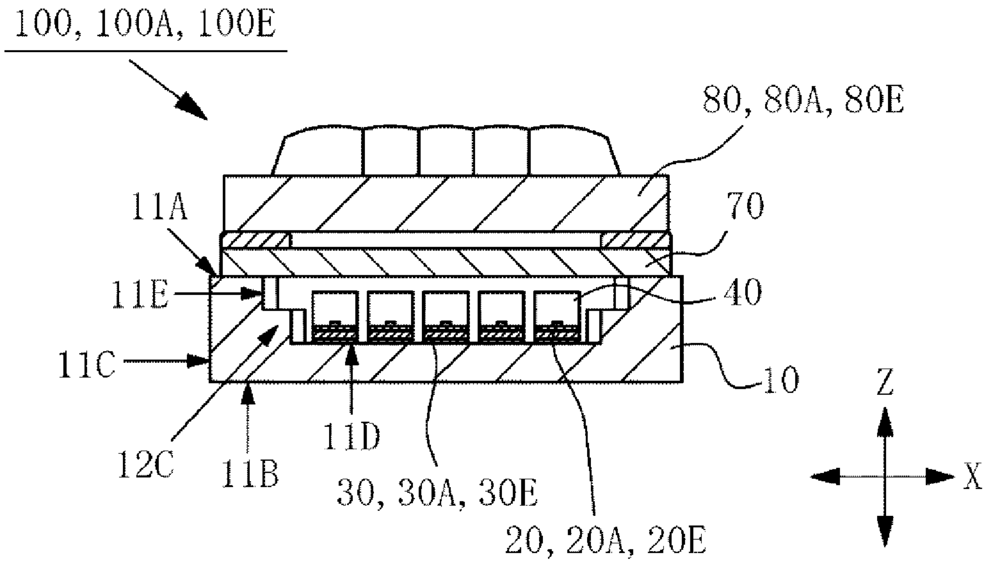
FIG. 3 is a schematic cross-sectional view taken along a cross-sectional line in FIG. 2.
Figure 4A:
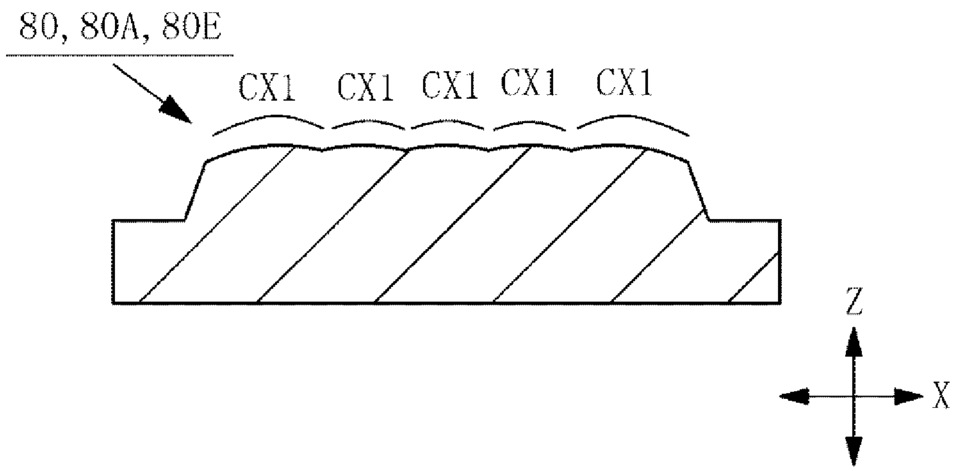
FIG. 4A is a schematic cross-sectional view of a first lens member and a fifth lens member, taken along a cross-sectional line IVA-IVA in FIG. 2.
Figure 4B:
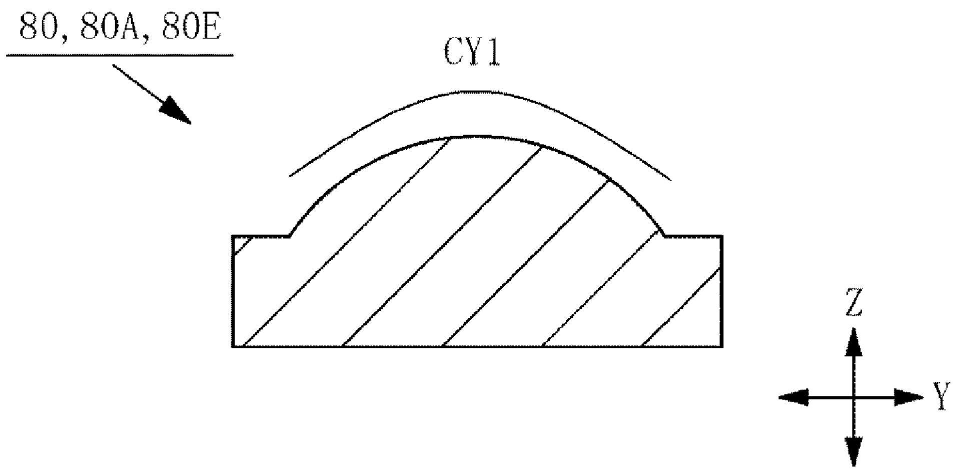
FIG. 4B is a schematic cross-sectional view of the first lens member and the fifth lens member, taken along a cross-sectional line IVB-IVB in FIG. 2.
Figure 5:
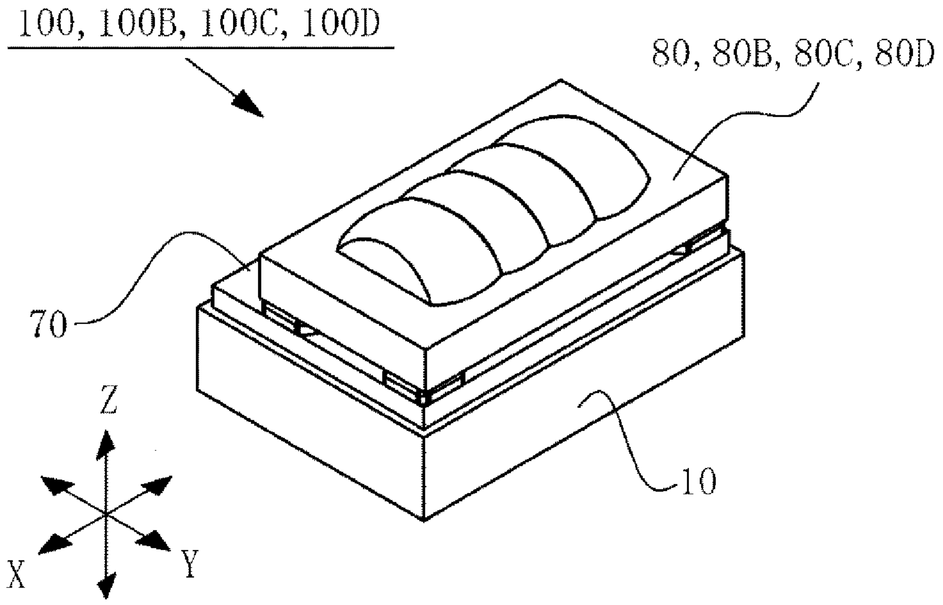
FIG. 5 is a schematic perspective view of a second light-emitting device, a third light-emitting device, and a fourth light-emitting device according to the embodiment.
Figure 6:
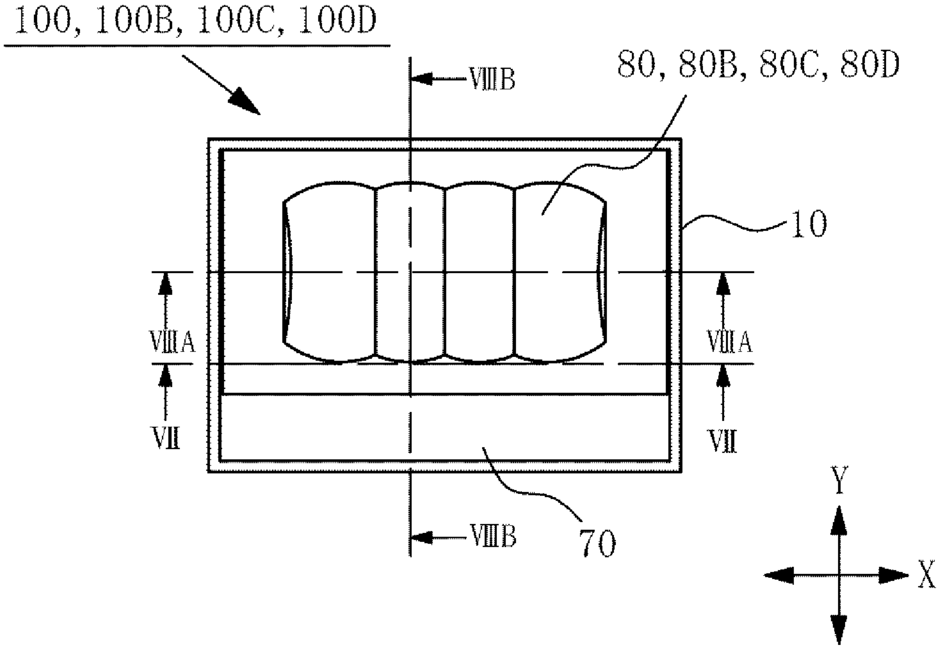
FIG. 6 is a schematic top view of the second light-emitting device, the third light-emitting device, and the fourth light-emitting device according to the embodiment.
Figure 7:
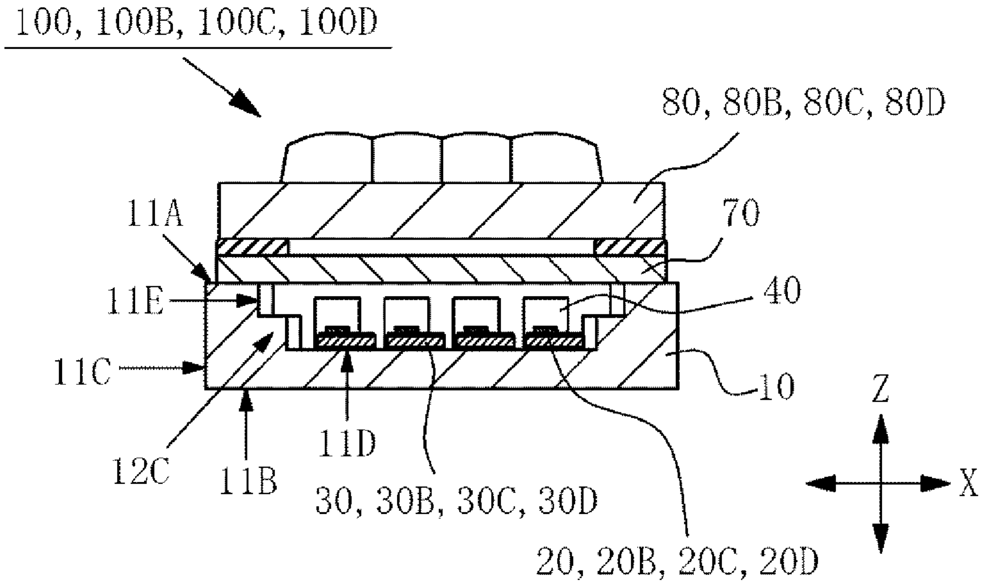
FIG. 7 is a schematic cross-sectional view taken along a cross-sectional line VII-VII in FIG. 6.
Figure 8A:
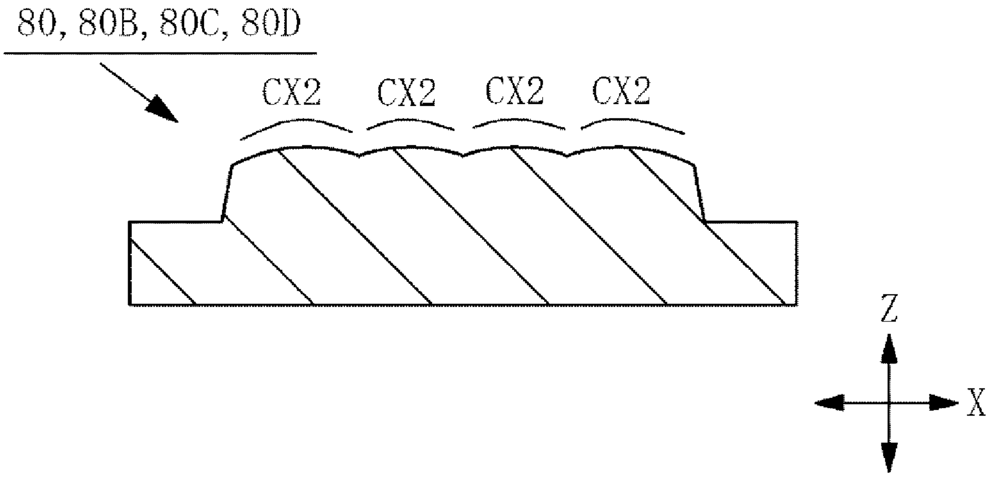
FIG. 8A is a schematic cross-sectional view of a second lens member, a third lens member, and a fourth lens member, taken along a cross-sectional line VIIIA-VIIIA in FIG. 6.
Figure 8B:
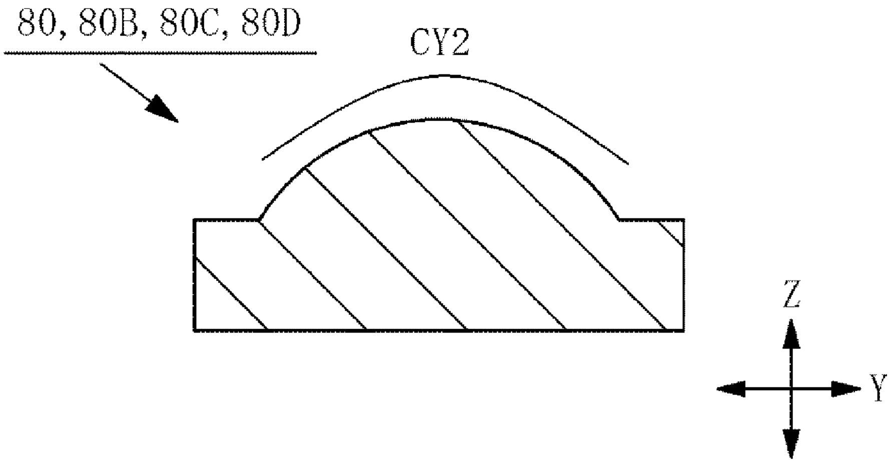
FIG. 8B is a schematic cross-sectional view of the second lens member, the third lens member, and the fourth lens member, taken along a cross-sectional line VIIIB-VIIIB in FIG. 6.
Figure 9:
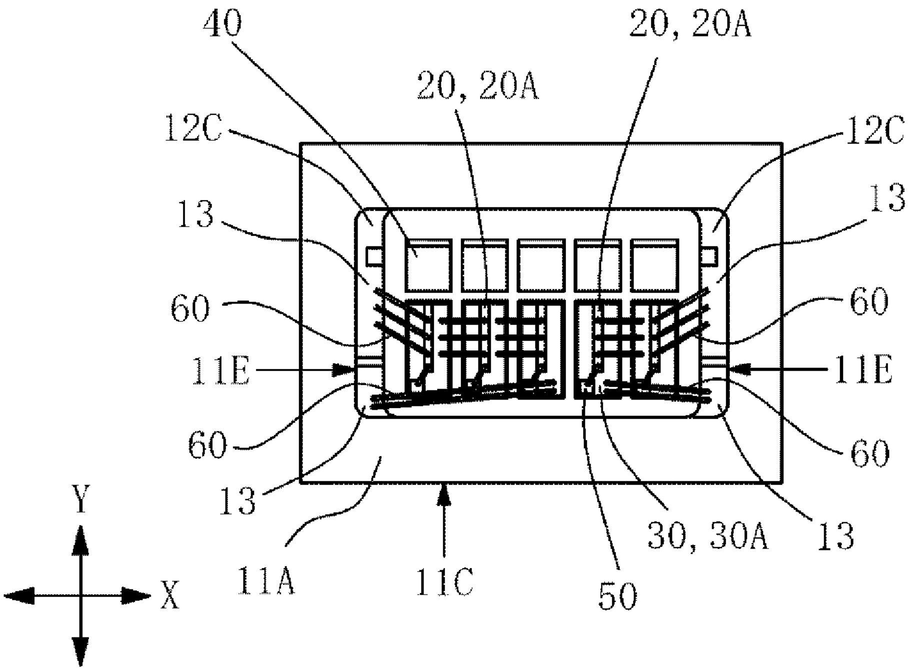
FIG. 9 is a schematic top view for illustrating each of components arranged in the interior of the first light-emitting device according to the embodiment.
Figure 10:
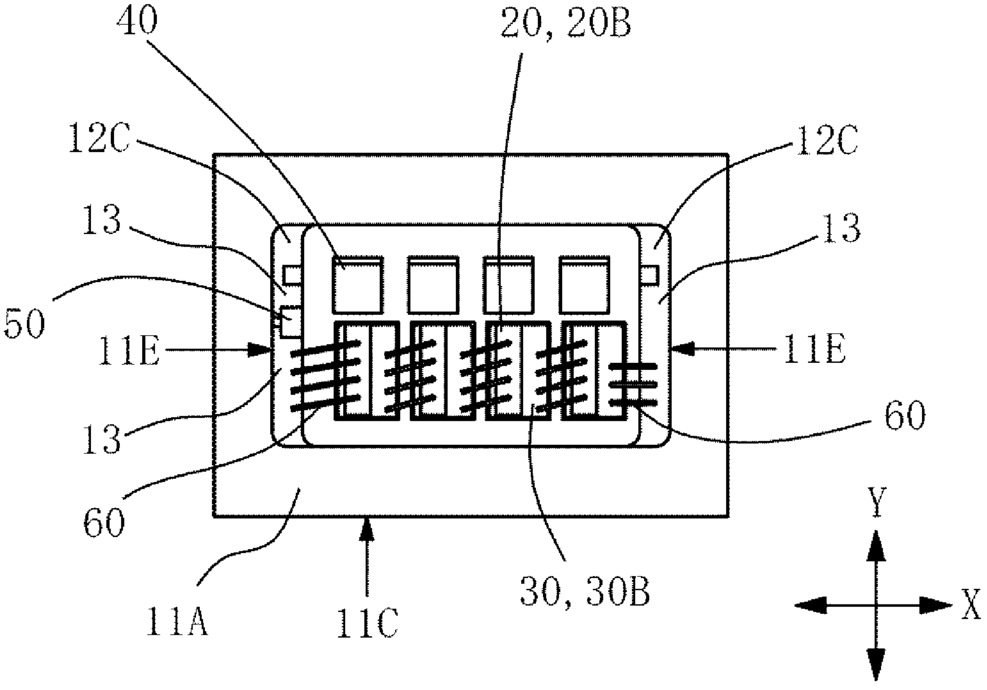
FIG. 10 is a schematic top view for illustrating each of components arranged in the interior of the second light-emitting device according to the embodiment.
Figure 11:
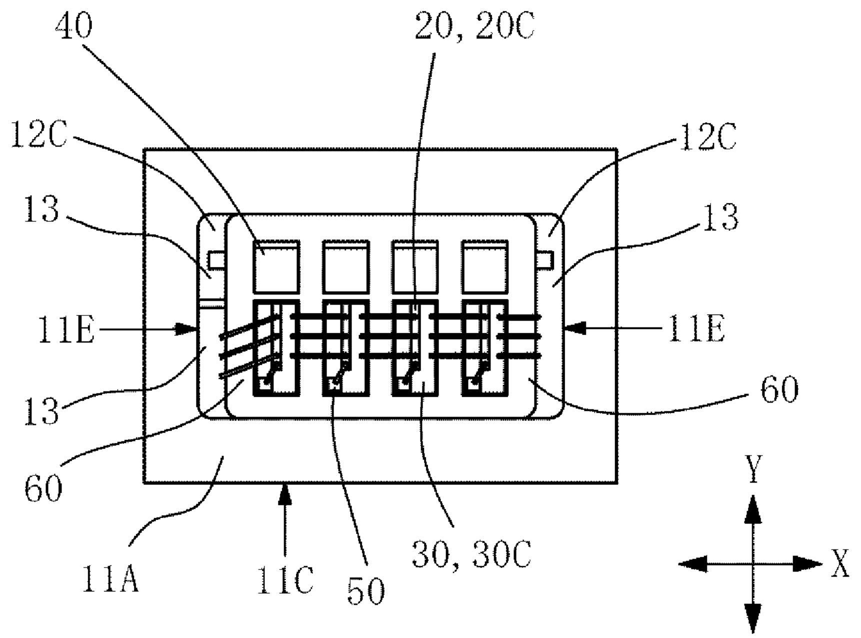
FIG. 11 is a schematic top view for illustrating each of components arranged in the interior of the third light-emitting device according to the embodiment.
Figure 12:
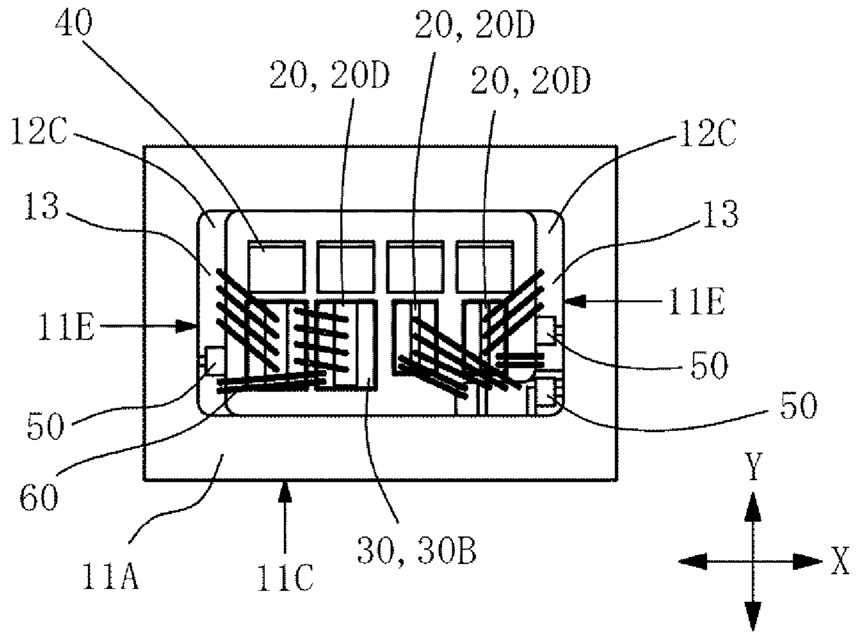
FIG. 12 is a schematic top view for illustrating each of components arranged in the interior of the fourth light-emitting device according to the embodiment.
Figure 13:
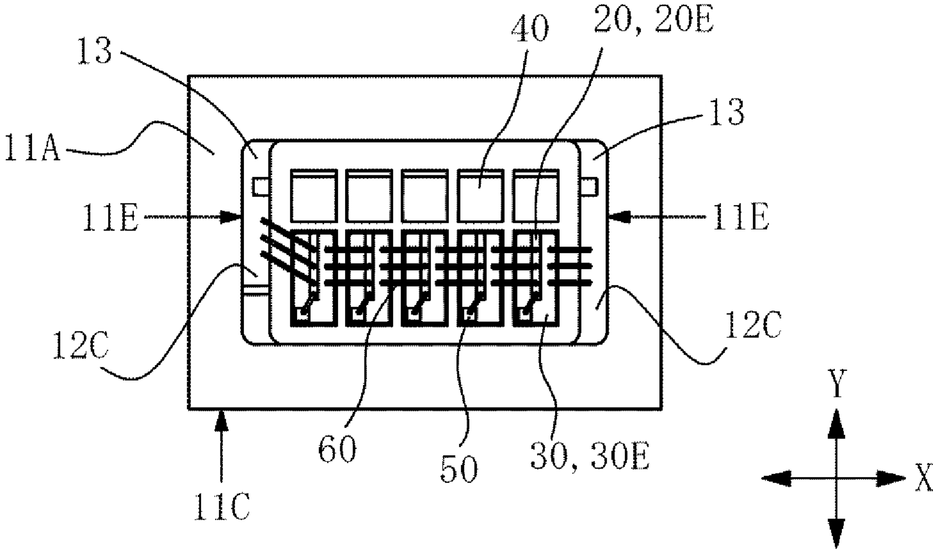
FIG. 13 is a schematic top view for illustrating each of components arranged in the interior of the fifth light-emitting device according to the embodiment.
Figure 14:
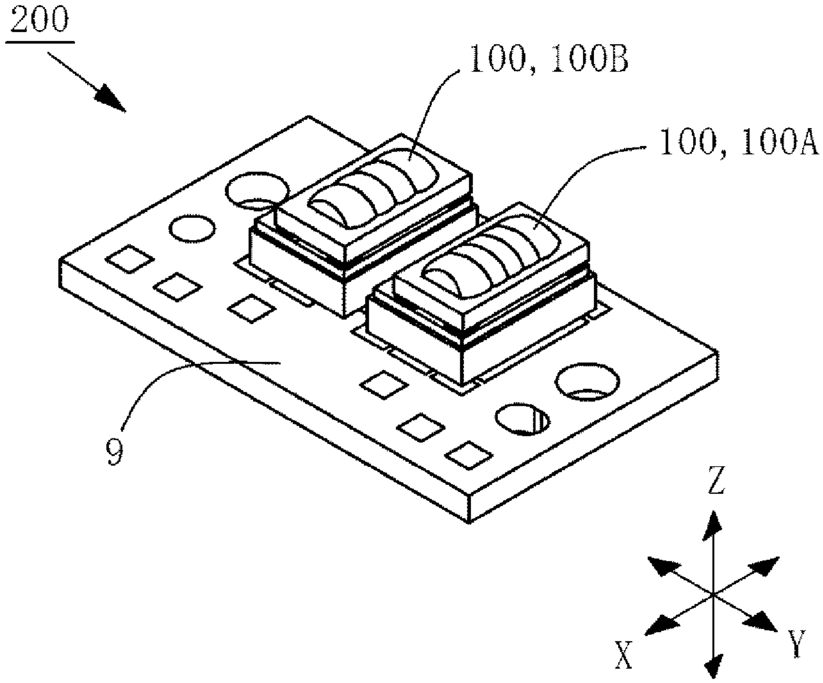
FIG. 14 is a schematic perspective view of a light-emitting module according to the embodiment.
Figure 15:
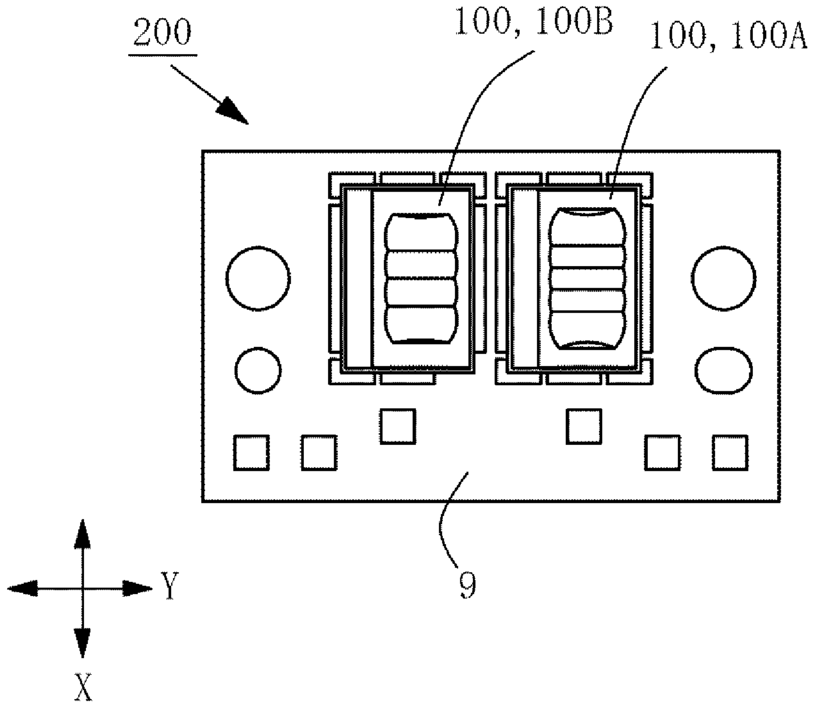
FIG. 15 is a schematic top view of the light-emitting module according to the embodiment.
Figure 16:
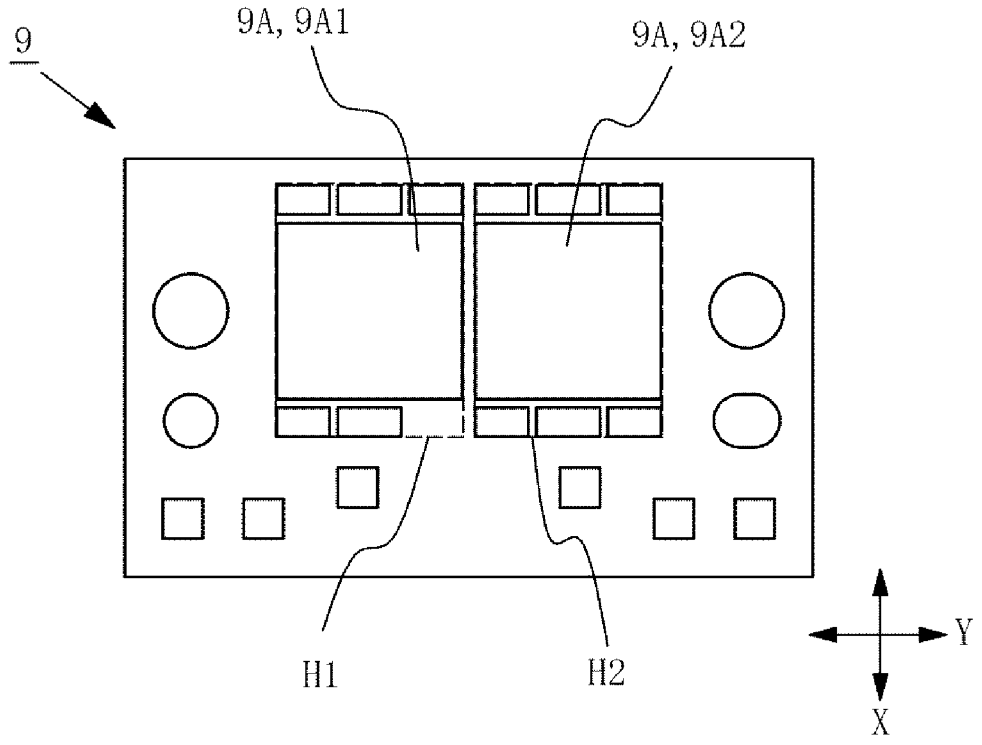
FIG. 16 is a schematic top view of a wiring substrate according to the embodiment.
Figure 17:
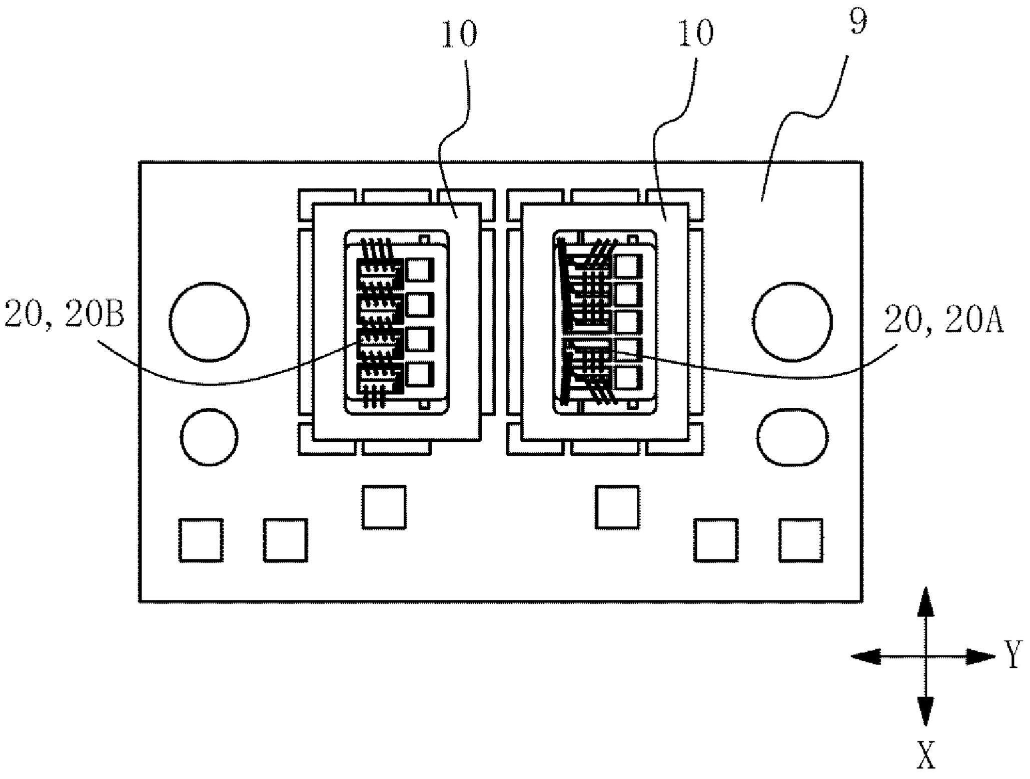
FIG. 17 is a schematic top view for illustrating each of components arranged in the interior of the light-emitting module according to the embodiment.

A light-emitting device 100 and a light-emitting module 200 according to one embodiment will be described. As the light-emitting device 100 according to the present embodiment, a first light-emitting device 100A, a second light-emitting device 100B, a third light-emitting device 100C, a fourth light-emitting device 100D, and a fifth light-emitting device 100E will be described. FIGS. 1 to 17 are drawings for describing exemplary forms of the light-emitting device 100 and the light-emitting module 200. FIG. 1 is a schematic perspective view of the first light-emitting device 100A and the fifth light-emitting device 100E. FIG. 2 is a schematic top view of the light-emitting device 100 illustrated in FIG. 1. FIG. 3 is a schematic cross-sectional view taken along a cross-sectional line III-III in FIG. 2. In the schematic cross-sectional view of FIG. 3, a protective element 50 and a wiring 60 are omitted. FIG. 4A is a schematic cross-sectional view of a first lens member 80A and a fifth lens member 80E, taken along a cross-sectional line IVA-IVA in FIG. 2. FIG. 4B is a schematic cross-sectional view of the first lens member 80A and the fifth lens member 80E taken along a cross-sectional line IVB-IVB in FIG. 2. FIG. 5 is a schematic perspective view of the second light-emitting device 100B, the third light-emitting device 100C, and the fourth light-emitting device 100D. FIG. 6 is a schematic top view of the light-emitting device 100 illustrated in FIG. 5. FIG. 7 is a schematic cross-sectional view taken along a cross-sectional line VII-VII in FIG. 6. In the schematic cross-sectional view of FIG. 7, the protective element 50 and the wiring 60 are omitted. FIG. 8A is a schematic cross-sectional view of a second lens member 80B, a third lens member 80C, and a fourth lens member 80D, taken along a cross-sectional line VIIIA-VIIIA in FIG. 6. FIG. 8B is a schematic cross-sectional view of the second lens member 80B, the third lens member 80C, and the fourth lens member 80D, taken along a cross-sectional line VIIIB-VIIIB in FIG. 6. FIG. 9 is a schematic top view for illustrating each of components arranged in the interior of the first light-emitting device 100A. FIG. 10 is a schematic top view for illustrating each of components arranged in the interior of the second light-emitting device 100B. FIG. 11 is a schematic top view for illustrating each of components arranged in the interior of the third light-emitting device 100C. FIG. 12 is a schematic top view for illustrating each of components arranged in the interior of the fourth light-emitting device 100D. FIG. 13 is a schematic top view for illustrating each of components arranged in the interior of the fifth light-emitting device 100E. FIG. 14 is a schematic perspective view of the light-emitting module 200. FIG. 15 is a schematic top view of the light-emitting module 200. FIG. 16 is a schematic top view of a wiring substrate 9 of the light-emitting module 200. FIG. 17 is a schematic top view of each of components arranged in the interior of the light-emitting module 200.

The light-emitting device 100 includes a plurality of components. The plurality of components of the light-emitting device 100 include a base 10, one or plurality of semiconductor laser elements 20, one or plurality of submounts 30, one or plurality of reflective members 40, one or plurality of the protective elements 50, one or plurality of the wirings 60, a cover 70, and a lens member 80.

The light-emitting module 200 includes a plurality of components. The plurality of components of the light-emitting module 200 include a plurality of the light-emitting devices 100, and the wiring substrate 9. The plurality of light-emitting devices 100 include two or more light-emitting devices among the first light-emitting device 100A, the second light-emitting device 100B, the third light-emitting device 100C, the fourth light-emitting device 100D, and the fifth light-emitting device 100E, which will be described later. For example, the plurality of light-emitting devices 100 include the first light-emitting device 100A and the second light-emitting device 100B.

The light-emitting device 100 and the light-emitting module 200 may also include a component other than the components described above. For example, the light-emitting device 100 may further include a light-emitting element different from the one or plurality of semiconductor laser elements 20. For example, the light-emitting module 200 may include a connector, a thermistor, and the like. The light-emitting device 100 and the light-emitting module 200 does not necessarily include some of the plurality of components described in the example herein.

Components of the light-emitting device 100 and the light-emitting module 200 will be described.

Base 10

The base 10 includes an upper surface 11A, a lower surface 11B, and one or plurality of outer lateral surfaces 11C. In a top view, an outer edge shape of the base 10 is rectangular. This rectangular shape may be a shape with long sides and short sides. In the base 10 illustrated in the drawings, a long side direction of the rectangle is the same direction as the X direction, and a short side direction is the same direction as the Y direction. The outer edge shape of the base 10 in a top view need not be a rectangular shape.

A recessed shape is formed in the base 10. A recessed shape being recessed downward from the upper surface 11A is formed from the upper surface 11A. A recess is defined by the recessed shape of the base 10. The recess is surrounded by the upper surface 11A in a top view.

Inner edges of the upper surface 11A defines outer edges of the recess. That is, an inner edge shape of the upper surface 11A and an outer edge shape of the recess are the same. In a top view, the outer edge shape of the recess is rectangular. This rectangular shape may be a shape with long sides and short sides. In the base 10 illustrated in the drawings, a long side direction of the rectangle is the same direction as the X direction, and a short side direction is the same direction as the Y direction. The outer edge shape of the recess is not necessarily rectangular.

The base 10 includes a mounting surface 11D. The base 10 includes one or plurality of inner lateral surfaces 11E. The mounting surface 11D is located at a location below the upper surface 11A and above the lower surface 11B. The mounting surface 11D is an upper surface. Thus, the mounting surface 11D is an upper surface different from the upper surface 11A. The mounting surface 11D is a surface having a shape that is wider in the X direction than in the Y direction.

The one or plurality of inner lateral surfaces 11E are located above the mounting surface 11D. The one or plurality of inner lateral surfaces 11E meet the upper surface 11A. The mounting surface 11D and the one or more inner lateral surfaces 11E are included in the plurality of surfaces defining the recess of the base 10. The one or plurality of inner lateral surfaces 11E are perpendicular to the mounting surface 11D. The term "perpendicular" here allows a difference within ±3 degrees. The inner lateral surface 11E is not necessarily perpendicular to the mounting surface 11D.

The base 10 includes one or plurality of stepped portions 12C. A stepped portion 12C includes an upper surface and an inner lateral surface that meets the upper surface and extends downward from the upper surface. The upper surface of the stepped portion 12C meets the inner lateral surface 11E. The inner lateral surface of the stepped portion 12C meets the mounting surface 11D.

A stepped portion 12C is formed along a part or the whole of a corresponding inner lateral surface 11E in a top view. In a top view, the one or plurality of stepped portions 12C are formed inward of the upper surface 11A. In a top view, the one or plurality of stepped portions 12C are formed inward of the one or plurality of inner lateral surfaces 11E.

The base 10 may include a plurality of stepped portions 12C. The plurality of stepped portions 12C are formed along inner lateral surfaces 11E in a top view. The plurality of stepped portions 12C include the stepped portion 12C formed along a corresponding inner lateral surface 11E over the entire length of the corresponding inner lateral surface 11E in a top view.

The plurality of stepped portions 12C include, in a top view, a stepped portion 12C (hereinafter referred to as a first stepped portion) formed along a first inner lateral surface 11E of the inner lateral surfaces 11E (hereinafter referred to as the first inner lateral surface 11E), and a stepped portion 12C (hereinafter referred to as a second stepped portion) formed along a second inner lateral surface 11E of the inner lateral surfaces 11E (hereinafter referred to as the second inner lateral surface 11E).

The first inner lateral surface 11E and the second inner lateral surface 11E face each other. The first inner lateral surface 11E and the second inner lateral surface 11E are both lateral surfaces extending in the Y direction. There may be a case in which the first stepped portion 12C is formed along only the first inner lateral surface 11E. There may be a case in which the second stepped portion 12C is formed along only the second inner lateral surface 11E. The first stepped portion 12C or the second stepped portion 12C may be formed along two of the inner lateral surfaces 11E that are contiguous. There may be a case in which the plurality of stepped portions 12C is formed by only the first stepped portion 12C and the second stepped portion 12C.

One or plurality of wiring patterns 13 are provided on the upper surface of the stepped portion 12C. The wiring pattern 13 is electrically connected to another wiring pattern via a wiring passing through the interior of the base 10. The other wiring pattern is provided on the lower surface of the base 10, for example. The wiring pattern 13 may be electrically connected to a wiring pattern provided on the upper surface 11A or the outer lateral surface 11C.

The plurality of wiring patterns 13 are provided on the upper surface of the one or plurality of stepped portions 12C. In each of the plurality of stepped portions 12C, one or plurality of wiring patterns 13 may be provided. By providing the wiring pattern 13 on the upper surface of the stepped portion 12C, the wiring can be connected at a position higher than the mounting surface 11D. This allows for facilitating bonding of a wiring. In the base 10, a location at which the wiring pattern 13 is provided may not be limited to the stepped portion 12C.

The base 10 can be formed using ceramic as a main material. The base 10 may be formed by bonding a bottom member, which is formed using metal or a composite containing metal as a main material and includes the mounting surface 11D, and a frame member, which is formed using ceramic as a main material and includes the wiring pattern 13.

As used herein, the term "main material" refers to a material that occupies the greatest ratio of a target formed product in terms of weight or volume. When a target formed product is formed of a single material, that material is the main material. That is, when a certain material is the main material, the percentage of that material may be 100%.

Examples of the ceramic include aluminum nitride, silicon nitride, aluminum oxide, and silicon carbide. Examples of the metal include copper, aluminum, iron, copper/molybdenum, copper/tungsten, and the like. Alternatively, as the composite containing metal, a copper-diamond composite material or the like can be used.

Semiconductor Laser Element 20

The semiconductor laser element 20 includes a light-emitting surface through which light is emitted. The semiconductor laser element 20 includes an upper surface, a lower surface, and a plurality of lateral surfaces. The upper surface or a lateral surface of the semiconductor laser element 20 is the light-emitting surface. The semiconductor laser element 20 includes one or plurality of the light-emitting surfaces.

A shape of the upper surface of the semiconductor laser element 20 is a rectangular shape having long sides and short sides. A lateral surface of the upper surface corresponding to a short side of the rectangle in a top view can serve as the light-emitting surface. The shape of the upper surface of the semiconductor laser element 20 need not be rectangular.

A single-emitter semiconductor laser element can be employed as the semiconductor laser element 20. A multi-emitter semiconductor laser element including a plurality of emitters can be employed as the semiconductor laser element 20.

For example, a light-emitting element that emits blue light, a light-emitting element that emits green light, or a light-emitting element that emits red light can be employed as the semiconductor laser element 20. A light-emitting element that emits light of another color or light having another wavelength may be employed as the semiconductor laser element 20.

In the present disclosure, "blue light" refers to light having a light emission peak wavelength within a range of 420 nm to 494 nm. "Green light" refers to light having a light emission peak wavelength within a range of 495 nm to 570 nm. "Red light" refers to light having a light emission peak wavelength within a range of 605 nm to 750 nm.

The semiconductor laser element 20 emits a directional laser beam. Divergent light that exhibits divergence is emitted from an emission end surface of the semiconductor laser element 20. The emission end surface of the semiconductor laser element 20 can be referred to as the light-emitting surface of the semiconductor laser element 20.

The light emitted from the semiconductor laser element 20 exhibits a far field pattern (hereinafter referred to as an "FFP") of an elliptical shape in a plane parallel to the emission end surface of the light. The FFP indicates a shape and a light intensity distribution of the emitted light at a position spaced apart from the emission end surface.

In the present specification, light passing through the center of the elliptical shape of the FFP, in other words, light having a peak intensity in the light intensity distribution of the FFP is referred to as "light traveling along an optical axis" or "light passing through an optical axis". Based on the light intensity distribution of the FFP, light having an intensity of $1/e^2$ or greater with respect to a peak intensity value is referred to as a "main portion of light".

The shape of the FFP of the light emitted from the semiconductor laser element 20 is an elliptical shape which is longer in a layering direction than in a direction perpendicular to the layering direction, in the plane parallel to the emission end surface of the light. The layering direction refers to a direction in which a plurality of semiconductor layers including an active layer are layered in the semiconductor laser element 20. The direction perpendicular to the layering direction can also be referred to as a surface direction of the semiconductor layer. A long diameter direction of the elliptical shape of the FFP can also be referred to as a fast axis direction of the semiconductor laser element 20, and a short diameter direction of the elliptical shape of the FFP can also be referred to as a slow axis direction of the semiconductor laser element 20.

Based on the light intensity distribution of the FFP, an angle at which light having a light intensity of $1/e^2$ of a peak light intensity spreads is referred to as a divergence angle of light of the semiconductor laser element 20. For example, a divergence angle of light may also be determined based on the light intensity that is half of the peak light intensity in addition to being determined based on the light intensity of $1/e^2$ of the peak light intensity. In the description herein, the term "divergence angle of light" refers to a divergence angle of light at the light intensity of $1/e^2$ of the peak light intensity. A divergence angle in the fast axis direction is greater than a divergence angle in the slow axis direction.

Examples of the semiconductor laser element 20 that emits blue light or the semiconductor laser element 20 that emits green light include a semiconductor laser element including a nitride semiconductor. A GaN-based semiconductor such as GaN, InGaN, and AlGaN, for example, can be used as the nitride semiconductor. Examples of the semiconductor laser element 20 that emits red light include a semiconductor laser element including an InAlGaP-based semiconductor, a GaInP-based semiconductor, or a GaAs-based semiconductor such as GaAs and AlGaAs.

Submount 30

The submount 30 includes an upper surface, a lower surface, and one or plurality of lateral surfaces. The submount 30 has an outer shape having a length in one direction greater than a length in a direction perpendicular to the one direction in a top view. The upper surface has a rectangular shape. The upper surface may have a rectangular shape having short sides and long sides. The upper surface may have a square shape.

The submount 30 has a rectangular parallelepiped shape. In the submount 30, a distance between the upper surface and the lower surface is smaller than a distance between the other two surfaces facing each other. This distance between the upper surface and the lower surface is referred to as a thickness of the submount 30. The shape of the submount 30 is not limited to the rectangular parallelepiped shape.

The submount 30 may be formed using, for example, silicon nitride, aluminum nitride, or silicon carbide. A metal film for bonding other components is provided on the submount 30.

Reflective Member 40

The reflective member 40 includes a lower surface, and a light reflective surface that reflects light. The light reflective surface is inclined with respect to the lower surface. In other words, the light reflective surface is not perpendicular nor parallel in an arrangement relationship when viewed from the lower surface. A straight line connecting a lower end and an upper end of the light reflective surface is inclined with respect to the lower surface of the reflective member 40. An angle of the light reflective surface with respect to the lower surface, or an angle of the straight line connecting the lower end and the upper end of the light reflective surface with respect to the lower surface is referred to as an inclination angle of the light reflective surface.

In the reflective member 40 illustrated in the drawings, the light reflective surface is a flat surface and forms an inclination angle of 45 degrees with respect to the lower surface of the reflective member 40. The light reflective surface is not limited to a flat surface, and may be, for example, a curved surface. The light reflective surface is not necessarily at an inclination angle of 45 degrees.

For the reflective member 40, glass, metal, or the like can be used as a main material. As the main material, a heat-resistant material is preferable, and for example, glass such as quartz or BK7 (borosilicate glass), or a metal such as aluminum can be employed. The reflective member 40 can also be formed using Si as the main material. When the main material is a reflective material, the light reflective surface can be formed of the main material. When the light reflective surface is formed of a material different from the main material, the light reflective surface can be formed using, for example, metal such as Ag or Al, or a dielectric multilayer film such as $Ta_2O_5/SiO_2$, $TiO_2/SiO_2$, and $Nb_2O_5/SiO_2$.

In the light reflective surface, a reflectance to the peak wavelength of the light irradiated on the light reflective surface is equal to or greater than 90%. The reflectance may be equal to or greater than 95%. The reflectance can be equal to or greater than 99%. The light reflectance is equal to or less than 100%, or is less than 100%.

Protective Element 50

The protective element 50 is provided to avoid breakage of a specific element (the semiconductor laser element, for example) by excessive current flowing through the element. The protective element 50 is a Zener diode, for example. A Zener diode formed of Si can be used as the Zener diode.

Wiring 60

The wiring 60 is a linear conductive material with bonded portions at both ends. The bonded portions at both ends are joint portions with other components. The wiring 60 is, for example, a metal wire. For example, gold, aluminum, silver, copper, or the like can be used as the metal.

Cover 70

The cover 70 includes a lower surface and an upper surface, and is formed in a flat plate-like rectangular parallelepiped shape. The shape is not necessarily the rectangular parallelepiped shape. The cover 70 has light transmissivity. The phrase "having light transmissivity" used herein means having light transmittance equal to or greater than 80%. The light transmittance with respect to all wavelengths may not be equal to or greater than 80%. The cover 70 may partially include a non-light transmissive region (a region that does not have light transmissivity).

The cover 70 is formed using glass as a main material. The main material forming the cover 70 is a material having high light transmissivity. The cover 70 is not limited to glass, and may be formed using sapphire as the main material, for example.

Lens Member 80

The lens member 80 includes an upper surface, a lower surface, and lateral surfaces. The lens member 80 exhibits an optical action, such as condensing, diffusing, or collimating, on incident light, and the light subjected to the optical action is emitted from the lens member 80.

The lens member 80 includes one or more lens surfaces. The one or more lens surfaces are located on the upper surface side of the lens member 80. The one or more lens surfaces may be located on the lower surface side of the lens member 80. The lens member 80 includes the upper surface and the lower surface each being a flat surface. The one or more lens surfaces meet the upper surface of the lens member 80. The one or more lens surfaces are surrounded by the upper surface of the lens member 80 in a top view. In a top view, the lens member 80 has a rectangular outer shape. The lower surface of the lens member 80 is rectangular.

In the lens member 80, a portion that overlaps the one or more lens surfaces in a top view is referred to as a lens portion, and a portion that does not overlap the one or more lens surfaces in a top view is referred to as a non-lens portion. In the lens member 80, a portion that overlaps the upper surface in a top view is included in the non-lens portion. When the lens portion is divided into two portions along a plane extending along the upper surface, a portion at the lens surface side can be defined as a lens shape portion, and a portion at the lower surface side can be defined as a flat plate shape portion, thus being distinguished from each other. The lower surface of the lens member 80 is formed of the lower surface of the lens portion and a lower surface of the non-lens portion.

In the lens member 80 including the plurality of lens surfaces, the plurality of lens surfaces are continuously formed in one direction. That is, in the plurality of lens surfaces, adjacent lens surfaces are coupled to each other and are aligned in the same direction. The lens member 80 is formed so that the vertices of the respective lens surfaces are positioned on a single virtual straight line. This virtual straight line is in the same direction as the X direction.

In the present disclosure, a direction in which the plurality of lens surfaces are aligned in a top view is referred to as a coupling direction. A length of the plurality of lens surfaces in the coupling direction is greater than a length in a direction perpendicular to the coupling direction in a top view. In the lens member 80 illustrated in the drawings, the coupling direction is the same direction as the X direction.

In the lens member 80, the curvature of the lens surface in the X direction is the same as the curvature in the Y direction. The curvature in the X direction may be different from the curvature in the Y direction. In the lens member 80, the plurality of lens surfaces have the same curvature as each other. The plurality of lens surfaces may include a lens surface having a curvature different from that of another lens surfaces.

The lens member 80 has light transmissivity. The lens member 80 has light transmissivity in both the lens portion and the non-lens portion. The lens member 80 can be formed using glass such as BK7, for example.

Wiring Substrate 9

The wiring substrate 9 includes an upper surface, a lower surface, and lateral surfaces. A plurality of connection patterns 9A are provided on the upper surface of the wiring substrate 9. The plurality of connection patterns 9A include a first connection pattern 9A1 and a second connection pattern 9A2. A plurality of wiring regions are provided on the upper surface of the wiring substrate 9.

Other components are bonded to the connection pattern 9A of the wiring substrate 9. The connection pattern 9A is divided into a plurality of connection regions on the upper surface of the wiring substrate 9. The plurality of connection regions include connection regions electrically connected to the wiring regions. The plurality of connection regions include connection regions that are not electrically connected to the wiring regions.

The plurality of connection patterns 9A are connection patterns that are the same as or similar to each other in a top view. The term "same or similar connection pattern" as used herein refers to the connection patterns form respective enclosing rectangles of the same shape. The "enclosing rectangle" as used herein refers to the smallest rectangle that surrounds the connection pattern 9A in a plan view. The plurality of connection patterns 9A have the same enclosing rectangle. In FIG. 16, the enclosing rectangles are indicated by dashed lines, the enclosing rectangle relating to the first connection pattern 9A1 is indicated by a reference character H1, and the enclosing rectangle relating to the second connection pattern 9A2 is indicated by a reference character H2.

The first connection pattern 9A1 and the second connection pattern 9A2 are the connection patterns 9A having different shapes from each other. The number (quantity) of the connection regions in the first connection pattern 9A1 is fewer than that of the second connection pattern 9A2. In a top view, the enclosing rectangle of the first connection pattern 9A1 and the enclosing rectangle of the second connection pattern 9A2 have the same size and shape.

The first connection pattern 9A1 and the second connection pattern 9A2 are arranged to be aligned. The first connection pattern 9A1 and the second connection pattern 9A2 are arranged in close proximity. A distance between the first connection pattern 9A1 and the second connection pattern 9A2 is in a range of 300 μm to 1000 μm.

Next, the light-emitting device 100 will be described. Hereinafter, the first light-emitting device 100A, the second light-emitting device 100B, the third light-emitting device 100C, the fourth light-emitting device 100D, and the fifth light-emitting device 100E, each of which is one form of the light-emitting device 100, will be described.

In the present embodiment, a person (hereinafter referred to as a provider) who manufactures the plurality of light-emitting devices 100 or transfers the plurality of light-emitting devices 100 to a third party, such as a customer, manufactures at least two or more forms of the light-emitting device 100, or transfers the at least two or more forms of the light-emitting device 100, from among the first light-emitting device 100A, the second light-emitting device 100B, the third light-emitting device 100C, the fourth light-emitting device 100D, and the fifth light-emitting device 100E.

The provider transfers two or more forms of the light-emitting device 100 to the same customer. Alternatively, the provider transfers two or more forms of the light-emitting device 100 to different customers. For example, some forms of two or more forms of the light-emitting device 100 are transferred to one customer, and the other forms of the two or more forms of are transferred to another customer. That is, while the light-emitting device 100 may be provided to a plurality of third parties, the light-emitting device 100 is manufactured or transferred by the same provider. Thus, two or more forms of the light-emitting device 100 are transferred to the same customer or different customers. In other words, in relation to other one or more light-emitting devices 100, each light-emitting device 100 is transferred to a customer who is the same as or different from a customer to whom another light-emitting device 100 is transferred. The term "person" or "customer" described above is assumed to be a corporation such as a company or a commercial organization rather than an individual, but may also be an individual.

In the present embodiment, the provider manufactures the light-emitting module 200 in which the light-emitting devices 100 in the plurality of forms are mounted on the wiring substrate 9, or transfers the light-emitting module 200 to the third party. The provider manufactures both the forms of the light-emitting device 100 and the form of the light-emitting module 200, or transfers these to the third party.

First Light-Emitting Device 100A

In the first light-emitting device 100A, the plurality of semiconductor laser elements 20 (hereinafter referred to as first semiconductor laser elements 20A) are arranged on the mounting surface 11D of the base 10. The plurality of first semiconductor laser elements 20A are sealed in a first package. The first package forms a sealed space which is an internal space in which the first semiconductor laser elements 20A are arranged. The first package can be formed by bonding the cover 70 to the base 10.

The first semiconductor laser element 20A is mounted on the submount 30. The first semiconductor laser element 20A is arranged on the upper surface of the submount 30, and is mounted on the mounting surface 11D via the submount 30. The first semiconductor laser element 20A may be mounted directly to the mounting surface 11D without disposing the submount 30 therebetween. The base 10 may include a protruding portion in place of the submount 30.

The first semiconductor laser element 20A is mounted on a first submount 30A that is one form of the submount 30. The first submount 30A has a shape different from that of a second submount 30B to be described later, which is another form of the submount 30. The first submount 30A can also be employed in other forms of the light-emitting device 100, to be described later.

Each of the plurality of first semiconductor laser elements 20A is arranged on a respective one of different first submounts 30A. A single first semiconductor laser element is arranged on a single first submount 30A. A plurality of first semiconductor laser elements 20A may be arranged on a single first submount 30A.

In the present specification, in a top view, a direction parallel to the light-emitting surface of the first semiconductor laser element 20A is referred to as a first direction, and a direction perpendicular to the first direction is referred to as a second direction. In the first light-emitting device 100A illustrated in the drawings, the first direction is the same direction as the X direction, and the second direction is the same direction as the Y direction.

The plurality of first semiconductor laser elements 20A are arranged to be aligned. The plurality of first semiconductor laser elements 20A are arranged to be aligned in the X direction. The X direction can be a longitudinal direction of the mounting surface 11D.

Each of the plurality of first semiconductor laser elements 20A emits light in the second direction. The light of the FFP in which the direction perpendicular to the mounting surface 11D is the fast axis direction is emitted from each of the light-emitting surfaces of the plurality of first semiconductor laser elements 20A. In the first light-emitting device 100A illustrated in the drawings, the fast axis direction is the same direction as the Z direction.

For all of the first semiconductor laser elements 20A, the divergence angle in the slow axis direction is equal to or less than 20 degrees. The divergence angle is an angle greater than 0 degrees. In a top view, the first submount 30A is longer in the second direction than in the first direction.

The plurality of first semiconductor laser elements 20A include one or plurality of the first semiconductor laser elements 20A that emit light of a first color (hereinafter referred to as first light). The first color is, for example, blue. The first color may be a color other than blue.

The plurality of first semiconductor laser elements 20A include one or plurality of the first semiconductor laser elements 20A that emit light of a second color (hereinafter referred to as second light). The second color is a color different from the first color. The second color is, for example, green. The second color may be a color other than green.

Of the semiconductor laser element 20 emitting first light and the semiconductor laser element 20 emitting second light, one may be mounted on the first submount 30A, and the other may be mounted on the submount 30 having the shape different from that of the first submount 30A. In the first light-emitting device 100A illustrated in the drawings, all of the first semiconductor laser elements 20A are mounted on the first submounts 30A.

In the first light-emitting device 100A illustrated in the drawings, two or more first semiconductor laser elements 20A each emitting first light and two or more first semiconductor laser elements 20A each emitting second light are included in the plurality of first semiconductor laser elements 20A. The plurality of first semiconductor laser elements 20A illustrated in the drawings is constituted by five semiconductor laser elements 20. The five semiconductor laser elements 20 include two semiconductor laser elements 20 each emitting first light and three semiconductor laser elements 20 each emitting the second light.

In the first light-emitting device 100A, the difference between the quantity of semiconductor laser elements 20 emitting first light and the quantity of semiconductor laser elements 20 emitting second light is three or less. In the first light-emitting device 100A illustrated in the drawings, this difference in the quantity is 1, and the quantity of semiconductor laser elements 20 emitting second light is larger than the quantity of semiconductor laser elements 20 emitting the first light.

The semiconductor laser element 20 emitting first light has higher photoelectric conversion efficiency (WPE: wall-plug efficiency) than the semiconductor laser element 20 emitting the second light. The WPE of the semiconductor laser element 20 emitting first light is larger than the WPE of the semiconductor laser element 20 emitting second light by 10% or more. Determining the quantity of semiconductor laser elements 20 according to the difference in WPE allows for adjusting the light amount balance of the light of each of the colors.

In the first light-emitting device 100A, the protective element 50 is mounted on the submount 30. The protective element 50 is arranged on the upper surface of the submount 30. The protective element 50 is arranged on the submount 30 on which the first semiconductor laser element 20A is arranged. The plurality of protective elements 50 are arranged on first submounts 30A that are different from each other.

In the first light-emitting device 100A, the one or plurality of reflective members 40 are arranged on the base 10. The reflective member 40 is arranged on the mounting surface 11D. The reflective member 40 includes the light reflective surface. The light emitted from the plurality of first semiconductor laser elements 20A is reflected at the one or plurality of light reflective surfaces. The light reflective surface is inclined at an angle of 45 degrees to a traveling direction of light passing along an optical axis. The light reflected at the light reflective surface travels upward.

The reflective member 40 can be provided in a one-to-one relationship with respect to the first semiconductor laser element 20A. In other words, the same quantity of the reflective members 40 as the quantity of the first semiconductor laser elements 20A can be arranged. In the first light-emitting device 100A, the plurality of reflective members 40 are arranged to be aligned in the first direction in a top view. All of the reflective members 40 have the same size and shape.

The light reflective surface of the reflective member 40 reflects 90% or more of the main portion of the irradiated light. A single reflective member 40 may be provided for a plurality of first semiconductor laser elements 20A. A single reflective member 40 may be provided for all of the first semiconductor laser elements 20A. Alternatively, the first light-emitting device 100A may have a configuration not including the reflective member 40.

In the first light-emitting device 100A, the first semiconductor laser elements 20A are electrically connected to the base 10 by the plurality of wirings 60. Among the plurality of first semiconductor laser elements 20A, the one or plurality of first semiconductor laser elements 20A emitting first light are electrically connected to the wiring patterns 13 provided on the first stepped portion 12C, and the one or plurality of first semiconductor laser elements 20A emitting second light are electrically connected to the wiring patterns 13 provided on the second stepped portion 12C.

In the first light-emitting device 100A, the semiconductor laser element 20 that emits first light and that is electrically connected to the wiring pattern 13 provided at the second stepped portion 12C is not necessarily employed. The semiconductor laser element 20 that emits second light and that is electrically connected to the wiring pattern 13 provided at the first stepped portion 12C is not necessarily employed. The semiconductor laser element 20 emitting first light and the semiconductor laser element 20 emitting second light can be separately driven, and the respective outputs thereof can thus be easily controlled.

In the first light-emitting device 100A, the cover 70 is bonded to the base 10. The cover 70 is arranged on the upper surface of the base 10. The cover 70 is located higher than the stepped portion 12C. By bonding the cover 70 to the base 10, a closed space surrounded by the base 10 and the cover 70 is generated. This space is the space in which the first semiconductor laser elements 20A are arranged.

By bonding the cover 70 to the base 10 under a predetermined atmosphere, a hermetically sealed closed space (sealed space) is created. By hermetically sealing the space in which the semiconductor laser element 20 is disposed, a deterioration in quality due to dust attraction can be reduced. The cover 70 is transmissive of light emitted from the first semiconductor laser element 20A. 90% or more of the main portion of the light emitted from the semiconductor laser element 20 passes through the cover 70 and is emitted to the outside.

In the first light-emitting device 100A, the lens member 80 is fixed to the first package. The lens member 80 is disposed above the cover 70. The lens member 80 is bonded to the cover 70. A first lens member 80A, which is one form of the lens member 80, is fixed to the first package. The quantity of lens surfaces of the first lens member 80A is different from that of a second lens member 80B, which is another form of the lens member 80 and is to be described below. The first lens member 80A can also be employed in another embodiment of the light-emitting device 100 to be described later.

Light emitted from each of the plurality of first semiconductor laser elements 20A is emitted from the first package, and is incident on the first lens member 80A. The light that has passed through the cover 70 is incident on an incident surface of the lens member 80. The light incident on the incident surface of the lens member 80 is emitted from the lens surface.

The first lens member 80A includes the same quantity of lens surfaces as the quantity of first semiconductor laser elements 20A constituting the plurality of first semiconductor laser elements 20A. Each of the plurality of lens surfaces of the first lens member 80A corresponds to a respective one of the plurality of first semiconductor laser elements 20A, and light emitted from the first semiconductor laser element 20A passes through the corresponding lens surface. The main portions of the lights emitted from respective ones of the first semiconductor laser elements 20A pass through lens surfaces different from one another and are emitted from the first lens member 80A. The light incident on the first lens member 80A becomes collimated light, for example, and is emitted from the first lens member 80A.

All of the plurality of lens surfaces of the first lens member 80A have the same curvature. The term "same curvature" used herein includes an error that occurs in manufacturing a plurality of the lens members. These plurality of lens surfaces have the same curvature CX1 in the X direction or the same curvature CY1 in the Y direction, or both the same curvature CX1 in the X direction and the same curvature CY1 in the Y direction. These curvatures of the lens surfaces are determined based on a specific semiconductor laser element 20 arranged in the light-emitting device 100. For example, in designing the first light-emitting device 100A, the curvatures of the lens surfaces are determined, on the basis of a position at which the first semiconductor laser element 20A emitting first light is to be arranged, such that a desired optical action is exerted with respect to the semiconductor laser element 20.

In the first light-emitting device 100A, the semiconductor laser elements 20 emitting first light and the semiconductor laser diode elements 20 emitting second light are arranged, so that the lens surfaces of the first lens member 80A are not designed as ideal lens surfaces that exert a desired optical action on the second light. Therefore, the accuracy of optical control with respect to first light by the first lens member 80A is likely to be higher than the accuracy of optical control with respect to second light by the first lens member 80A.

The plurality of first semiconductor laser element 20A are arranged so that the light-emitting surfaces of the semiconductor laser elements 20 emitting second light and the light-emitting surfaces of the semiconductor laser elements 20 emitting first light are not in the same plane. By adjusting the position of the semiconductor laser element 20 emitting second light with reference to the position at which the semiconductor laser element 20 emitting first light is arranged, it is possible to improve the accuracy of the optical action exerted on respect to the second light, even with lens surfaces having such a curvature.

The lens portion of the lens member 80 is located at a position closer to one of the outer lateral surfaces 11C, of the two outer lateral surfaces 11C of the base 10 that are located on opposite sides to each other in the direction perpendicular to the coupling direction. In the coupling direction, the lens portion of the lens member 80 is located at a position spaced apart by the same distance from each of the outer lateral surfaces 11C of the base 10 located on opposite sides to each other.

Second Light-Emitting Device 100B

In the second light-emitting device 100B, one or plurality of semiconductor laser elements 20 (hereinafter referred to as second semiconductor laser elements 20B) are arranged on the mounting surface 11D of the base 10. The one or more second semiconductor laser elements 20B are sealed in a second package. The second package forms a sealed space which is an internal space in which the second semiconductor laser element(s) 20B are arranged. The second package can be formed by bonding the cover 70 to the base 10.

The second package has an outer shape that is the same as that of the first package. When a minimum rectangle enclosing the first package and a minimum rectangle enclosing the second package are the same shape in a top view and the first package and the second package have the same height, such shapes of the first package and the second package can be included in the interpretation of "the first package and the second package having the same outer shape."

The second semiconductor laser element 20B is mounted on the submount 30. The second semiconductor laser element 20B is mounted on the second submount 30B. The second semiconductor laser element 20B is arranged on the upper surface of the submount 30, and is mounted on the mounting surface 11D via the submount 30. The second semiconductor laser element 20B may be mounted directly to the mounting surface 11D without disposing the submount 30 therebetween. The base 10 may include a protruding portion in place of the submount 30.

Each of the plurality of second semiconductor laser elements 20B is arranged on a respective one of second submounts 30B different from each other. A single second semiconductor laser element 20B is arranged on a single second submount 30B. A plurality of second semiconductor laser elements 20B may be arranged on a single submount 30.

In the present specification, in a top view, a direction parallel to the light-emitting surface of the second semiconductor laser element 20B is referred to as a third direction, and a direction perpendicular to the third direction is referred to as a fourth direction. In the second light-emitting device 100B illustrated in the drawings, the third direction is the same direction as the X direction, and the fourth direction is the same direction as the Y direction.

The plurality of second semiconductor laser elements 20B are arranged to be aligned. The plurality of second semiconductor laser elements 20B are arranged to be aligned in the X direction. The X direction can be a longitudinal direction of the mounting surface 11D.

Each of the one or more second semiconductor laser elements 20B emits light in the fourth direction. The light of the FFP in which the direction perpendicular to the mounting surface 11D is the fast axis direction is emitted from each of the light-emitting surfaces of the one or more second semiconductor laser elements 20B. In the second light-emitting device 100B illustrated in the drawings, the fast axis direction is the same direction as the Z direction.

A length of the second submount 30B in the third direction is greater than a length of the first submount 30A in the first direction. A length of the second submount 30B in the fourth direction is less than or equal to a length of the first submount 30A in the second direction.

The one or more second semiconductor laser elements 20B is constituted of one or plurality of semiconductor laser elements 20 that emits light of a color other than the first color. In other words, the plurality of first semiconductor laser elements 20A include a semiconductor laser element 20 that emits first light, which is light of a color different from any of the one or more second semiconductor laser elements 20B.

The one or more second semiconductor laser elements 20B include one or plurality of semiconductor laser elements 20 that emit light of a third color (hereinafter referred to as third light). All the one or more second semiconductor laser elements 20B can be semiconductor laser elements 20 that emit third light. Third color is a color different from both the first color and the second color. The third color is, for example, red. The third color may be a color other than red.

First light, second light, and third light are lights of colors different from one another, and are lights of colors selected from red, green, and blue. When the first light-emitting device 100A and the second light-emitting device 100B are combined, RGB light can be obtained.

The quantity of second semiconductor laser elements 20B constituting the one or more second semiconductor laser elements 20B in the second light-emitting device 100B is one or more less than the quantity of first semiconductor laser elements 20A constituting the plurality of semiconductor laser elements 20A in the first light-emitting device 100A. The difference in the quantity of the semiconductor laser elements 20 between the first light-emitting device 100A and the second light-emitting device 100B illustrated in the drawings is 1.

In the second light-emitting device 100B illustrated in the drawings, the one or more second semiconductor laser elements 20B is constituted of four semiconductor laser elements 20. Each of the one or more second semiconductor laser elements 20B is a semiconductor laser element 20 that emits third light.

In the second light-emitting device 100B, the protective element 50 is mounted on the base 10. The protective element 50 is arranged on the upper surface of the stepped portion 12C of the base 10. In the second light-emitting device 100B illustrated in the drawings, the one or more second semiconductor laser elements 20B are protected by a single protective element 50.

In the second light-emitting device 100B, one or plurality of reflective members 40 are arranged on the base 10. The reflective member 40 is arranged on the mounting surface 11D. The reflective member 40 includes the light reflective surface. Light emitted from the one or more second semiconductor laser elements 20B is reflected at the one or plurality of light reflective surfaces. The light reflective surface is inclined at an angle of 45 degrees to a traveling direction of light passing along an optical axis. The light reflected at the light reflective surface travels upward.

The reflective member 40 can be provided in a one-to-one relationship with respect to the second semiconductor laser element 20B. In other words, the same quantity of the reflective members 40 as the quantity of the second semiconductor laser elements 20B can be arranged. In the second light-emitting device 100B, the plurality of reflective members 40 are arranged to be aligned in the third direction in a top view. All of the reflective members 40 have the same size and shape.

The reflective members 40 of the same size and shape can be employed as the reflective member 40 of the first light-emitting device 100A and the reflective member 40 of the second light-emitting device 100B. The reflective members 40 of different sizes and/or shapes can be employed in respective light-emitting devices 100.

The light reflective surface of the reflective member 40 reflects 90% or more of the main portion of the irradiated light. A single reflective member 40 may be provided for one or more second semiconductor laser elements 20B. A single reflective member 40 may be provided for all of the second semiconductor laser elements 20B. Alternatively, the second light-emitting device 100B may have a configuration not including the reflective member 40.

In the second light-emitting device 100B, the second semiconductor laser elements 20B are electrically connected to the base 10 by the plurality of wirings 60. The one or more second semiconductor laser elements 20B are electrically connected to the wiring pattern 13 provided on the first stepped portion 12C and the wiring pattern 13 provided on the second stepped portion 12C.

In the second light-emitting device 100B, the cover 70 is bonded to the base 10. The cover 70 is arranged on the upper surface of the base 10. The cover 70 is located higher than the stepped portion 12C. By bonding the cover 70 to the base 10, a closed space surrounded by the base 10 and the cover 70 is generated. This space is a space in which the second semiconductor laser element(s) 20B are arranged.

By bonding the cover 70 to the base 10 under a predetermined atmosphere, a hermetically sealed closed space (sealed space) is created. By hermetically sealing the space in which the semiconductor laser element 20 is disposed, a deterioration in quality due to dust attraction can be reduced. The cover 70 is transmissive of light emitted from the second semiconductor laser element 20B. 90% or more of the main portion of the light emitted from the semiconductor laser element 20 passes through the cover 70 and is emitted to the outside.

In the second light-emitting device 100B, the lens member 80 is fixed to the second package. The lens member 80 is disposed above the cover 70. The lens member 80 is bonded to the cover 70. A second lens member 80B is fixed to the second package. The quantity of the lens surfaces of the second lens member 80B is less than the quantity of the lens surfaces of the first lens member 80A. In the first light-emitting device 100A and the second light-emitting device 100B that are illustrated in the drawings, the quantity of the lens surfaces of the first lens member 80A is greater than the quantity of the lens surfaces of the second lens member 80B by one.

Light emitted from each of the one or more second semiconductor laser elements 20B is emitted from the second package, and is incident on the second lens member 80B. The light that has passed through the cover 70 is incident on an incident surface of the lens member 80. The light incident on the incident surface of the lens member 80 is emitted from the lens surface.

The second lens member 80B includes the same quantity of lens surfaces as the quantity of second semiconductor laser element(s) 20B constituting the one or more second semiconductor laser elements 20B. Each of the one or more lens surfaces of the second lens member 80B corresponds to a respective one of the one or more second semiconductor laser elements 20B, and light emitted from the second semiconductor laser element 20B passes through the corresponding lens surface. The main portions of the lights emitted from respective ones of the second semiconductor laser elements 20B pass through lens surfaces different from one another and are emitted from the second lens member 80B. The light incident on the second lens member 80B becomes collimated light, for example, and is emitted from the second lens member 80B.

A width of a lens surface of the first lens member 80A in the direction in which the plurality of lens surfaces of the first lens member 80A are aligned is smaller than a width of a lens surface of the second lens member 80B in the direction in which the one or plurality lens surfaces of the second lens member 80B are aligned. When the lens member 80 has a lens surface other than lens surfaces at two opposite ends of the lens member 80, a width of the lens surface other than the lens surfaces at two opposite ends may be compared between the first lens member 80A and the second lens member 80B.
Alternatively, comparison in a width of a lens surface between the first lens member 80A and the second lens member 80B can be made by comparing an average of widths of all lens surfaces of the first lens member 80A and that of the second lens member 80B.

All of the one or more lens surfaces of the second lens member 80B have the same curvature. The lens surfaces of the second lens member 80B have the same curvature CX2 in the X direction, the same curvature CY2 in the Y direction, or both the same curvature CX2 in the X direction and the same curvature CY2 in the Y direction. These curvatures of the lens surfaces are determined based on a specific semiconductor laser element 20 arranged in the light-emitting device 100. For example, also for the second lens member 80B in the second light-emitting device 100B, in designing the first light-emitting device 100A, the curvatures of the lens surfaces of the second lens member 80B are determined, on the basis of a position at which the first semiconductor laser element 20A to emit first light is to be arranged, such that a desired optical action is exerted with respect to this semiconductor laser element 20.

In the second light-emitting device 100B, the one or more second semiconductor laser elements 20B do not include a semiconductor laser element 20 that emits first light, so that the lens surfaces of the second lens member 80B are not designed as ideal lens surfaces that exert a desired optical action on light from the second semiconductor laser element 20B. Therefore, when compared to a case in which first light transmits the second lens member 80B, the accuracy of optical control by the second lens member 80B with respect to first light is likely to be higher than the accuracy of optical control by the second lens member 80B with respect to second light.

On the other hand, the curvatures of the lens surfaces of the first lens member 80A and the lens surfaces of the second lens member 80B are determined by a uniform or standardized design idea. To put it more simply, instead of providing lens members 80 each having an optimum curvature of the lens surface corresponding to a respective one of different types of light-emitting devices 100, the first lens member 80A and the second lens member 80B are formed corresponding to a specific semiconductor laser element 20 to be employed in the light-emitting device 100, or corresponding to a specific light-emitting device 100. Providing the lens member 80 in such a manner allows for simplifying the inventory management of lens materials 80 even when light-emitting devices 100 of multiple forms are manufactured corresponding to the multiple color variations that are required, so that the environmental impact of having a large inventory can be reduced.

The first light-emitting device 100A and the second light-emitting device 100B are light-emitting devices 100 with the lens members 80 based on such a technical idea. Accordingly, a curvature of a lens surface of the first lens member 80A where first light emitted from the first semiconductor laser element 20A passes through is the same as a curvature of a lens surface of the second lens member 80B where the light emitted from the second semiconductor laser element 20B passes through. In these two lens surfaces, the curvature CX1 and the curvature CX2 in the X direction are the same curvature, the curvature CY1 and the curvature CY2 in the Y direction are the same curvature, or all the curvature CX1, the curvature CX2, the curvature CY1, and the curvature CY2 in the X direction and the Y direction are the same curvature.

Similarly to adjustment in position of the semiconductor laser element 20 that emits second light in the first light-emitting device 100A, the position of the second semiconductor laser element 20 is adjusted according to light to be emitted. The positional relationship between the light-emitting surface of the semiconductor laser element 20 that emits first light in the first light-emitting device 100A and an apex of the lens surface corresponding to this semiconductor laser element 20 and the positional relationship between the light-emitting surface of the second semiconductor laser element 20B in the second light-emitting device 100B and an apex of the lens surface corresponding to this second semiconductor laser element 20B are different from each other. Specifically, the optical path length of light traveling along the optical axis from the light-emitting surface to the lens surface is different between the semiconductor laser element 20 emitting first light and the second semiconductor laser element 20B. Such an adjustment of the position of the second semiconductor laser element 20B allows for, even when using lens surfaces of such a curvature, improving the accuracy of the optical action exerted on light emitted from the second semiconductor laser element 20B.

The lens portion of the lens member 80 is located at a position closer to one of the outer lateral surfaces 11C of the two outer lateral surfaces 11C of the base 10 that are located on opposite sides to each other in the direction perpendicular to the coupling direction. In the coupling direction, the lens portion of the lens member 80 is located at a position spaced apart by the same distance from each of the outer lateral surfaces 11C of the base 10 located on opposite sides to each other.

Third Light-Emitting Device 100C

In the third light-emitting device 100C, one or plurality of semiconductor laser elements 20 (hereinafter referred to as third semiconductor laser elements 20C) are arranged on the mounting surface 11D of the base 10. The one or more third semiconductor laser elements 20C are sealed in a third package. The third package forms a sealed space which is an internal space in which the third semiconductor laser element(s) 20C are arranged. The third package can be formed by bonding the cover 70 to the base 10.

The third package has an outer shape that is the same as that of the second package. Alternatively, the third package may be a package that is the same as the second package. When a minimum rectangle enclosing the second package and a minimum rectangle enclosing the third package are the same shape in a top view and the second package and the third package have the same height, such shapes of the second package and the third package can be included in the interpretation of "the second package and the third package having the same outer shape."

The third semiconductor laser element 20C is mounted on the submount 30. The third semiconductor laser element 20C is mounted on a third submount 30C. The third submount 30C is a submount 30 that is the same as the first submount 30A. In other words, in the third light-emitting device 100C, the semiconductor laser element 20 can be mounted using the submount 30 that is the same as the submount 30 used in the first light-emitting device 100A. The third semiconductor laser element 20C is arranged on the upper surface of the submount 30, and is mounted on the mounting surface 11D via the submount 30. The third semiconductor laser element 20C may be mounted directly to the mounting surface 11D without disposing the submount 30 therebetween. The base 10 may include a protruding portion in place of the submount 30.

Each of the plurality of third semiconductor laser elements 20C is arranged on a respective one of different third submounts 30C that are different from each other. A single third semiconductor laser element 20C is arranged on a single third submount 30C. A plurality of third semiconductor laser elements 20C may be arranged on a single submount 30.

In the present specification, in a top view, a direction parallel to the light-emitting surface of the third semiconductor laser element 20C is referred to as a fifth direction, and a direction perpendicular to the fifth direction is referred to as a sixth direction. In the third light-emitting device 100C illustrated in the drawings, the fifth direction is the same direction as the X direction, and the sixth direction is the same direction as the Y direction.

Each of the one or more third semiconductor laser elements 20C emits light in the sixth direction. The light of the FFP in which the direction perpendicular to the mounting surface 11D is the fast axis direction is emitted from each of the light-emitting surfaces of the one or more third semiconductor laser elements 20C. In the third light-emitting device 100C illustrated in the drawings, the fast axis direction is the same direction as the Z direction.

The one or more third semiconductor laser elements 20C include one or plurality of semiconductor laser elements 20 that emit first light. All the one or more third semiconductor laser elements 20C can be semiconductor laser elements 20 that emit first light.

The quantity of third semiconductor laser elements 20C constituting the one or more third semiconductor laser elements 20C in the third light-emitting device 100C is the same as the quantity of second semiconductor laser elements 20B constituting the one or more second semiconductor laser elements 20B in the second light-emitting device 100B.

In the third light-emitting device 100C, the protective element 50 is mounted on the submount 30. The protective element 50 is arranged on the submount 30 on which the third semiconductor laser element 20C is arranged. The one or plurality of protective elements 50 are arranged on the third submounts 30C that are different from each other.

In the third light-emitting device 100C, the one or plurality of reflective members 40 are arranged on the base 10. The reflective member 40 is arranged on the mounting surface 11D. The reflective member 40 includes the light reflective surface. Light emitted from the one or more third semiconductor laser elements 20C is reflected at the one or plurality of light reflective surfaces. The light reflective surface of the reflective member 40 reflects 90% or more of the main portion of the irradiated light.

In the third light-emitting device 100C, the third semiconductor laser elements 20C are electrically connected to the base 10 by the plurality of wirings 60. The one or more third semiconductor laser elements 20C are electrically connected to the wiring pattern 13 provided on the first stepped portion 12C and the wiring pattern 13 provided on the second stepped portion 12C.

In the third light-emitting device 100C, the cover 70 is bonded to the base 10. The cover 70 is arranged on the upper surface of the base 10. The cover 70 is located higher than the stepped portion 12C. By bonding the cover 70 to the base 10, a closed space surrounded by the base 10 and the cover 70 is generated. This space is a space in which the third semiconductor laser element(s) 20C are arranged.

By bonding the cover 70 to the base 10 under a predetermined atmosphere, a hermetically sealed closed space (sealed space) is created. By hermetically sealing the space in which the semiconductor laser element 20 is disposed, a deterioration in quality due to dust attraction can be reduced. The cover 70 is transmissive of light emitted from the third semiconductor laser element 20C. 90% or more of the main portion of the light emitted from the semiconductor laser element 20 passes through the cover 70 and is emitted to the outside.

In the third light-emitting device 100C, the lens member 80 is fixed to the third package. The lens member 80 is disposed above the cover 70. The lens member 80 is bonded to the cover 70. A third lens member 80C is fixed to the third package.

The third lens member 80C includes the same quantity of lens surfaces as the quantity of third semiconductor laser element(s) 20C constituting the one or more third semiconductor laser elements 20C. Each of the one or more lens surfaces of the third lens member 80C corresponds to a respective one of the one or more third semiconductor laser elements 20C, and light emitted from the third semiconductor laser element 20C passes through the corresponding lens surface. The main portions of the lights emitted from respective ones of the third semiconductor laser elements 20C pass through lens surfaces different from one another and are emitted from the third lens member 80C. The light incident on the third lens member 80C becomes collimated light, for example, and is emitted from the third lens member 80C.

All of the one or more lens surfaces of the third lens member 80C have the same curvature. The lens surfaces of the third lens member 80C have the same curvature CX2 in the X direction, the same curvature CY2 in the Y direction, or both the same curvature CX2 in the X direction and the same curvature CY2 in the Y direction. These curvatures of these lens surfaces are determined based on a specific semiconductor laser element 20 arranged in the light-emitting device 100. For example, in designing the first light-emitting device 100A, the curvatures of the lens surfaces are determined, on the basis of a position at which the semiconductor laser element 20A to emit first light is to be arranged, such that a desired optical action is exerted with respect to this semiconductor laser element 20. Also, for example, in designing the third light-emitting device 100C, the curvatures of the lens surfaces are determined, on the basis of a position at which the semiconductor laser element 20 to emit first light is to be arranged, such that a desired optical action is exerted with respect to this semiconductor laser element 20.

The positional relationship between the light-emitting surface of the first semiconductor laser element 20 that emits first light in the first light-emitting device 100A and an apex of the lens surface corresponding to this semiconductor laser element 20 and the positional relationship between the light-emitting surface of the semiconductor laser element 20 that emits first light in the third light-emitting device 100C and an apex of the lens surface corresponding to this semiconductor laser element 20 are the same. The lens surface of the third lens member 80C can have a curvature that collimates first light emitted from the third semiconductor laser element 20C.

The curvature of the lens surface of the third lens member 80C where first light emitted from the third semiconductor laser element 20C passes through is the same as the curvature of the lens surface of the second lens member 80B where light emitted from the second semiconductor laser element 20B passes through. These two lens surfaces have the same curvature CX2 in the X direction, the same curvature CY2 in the Y direction, or both the same curvature CX2 in the X direction and the same curvature CY2 in the Y direction.

The third lens member 80C can be a lens member 80 that is the same as the second lens member 80B. The third light-emitting device 100C has a package that is the same as or similar to the package of the second light-emitting device 100B, and includes the third semiconductor laser element 20C that emits first light. Even in such a light-emitting device 100, employing substantially the same lens members 80 as the second lens member 80B and the third lens member 80C allows for simplifying inventory management of the lens member 80, so that the environmental impact of having a large amount of inventory can be reduced.

The lens portion of the lens member 80 is located at a position closer to one of the outer lateral surfaces 11C, of the two outer lateral surfaces 11C of the base 10 that are located on opposite sides to each other in the direction perpendicular to the coupling direction. In the coupling direction, the lens portion of the lens member 80 is located at a position spaced apart by the same distance from each of the outer lateral surfaces 11C of the base 10 located on opposite sides to each other.

When the first light-emitting device 100A and the second light-emitting device 100B are combined, three different colors of light can be emitted. Accordingly, an RGB light source can be provided. Further, by providing the third light-emitting device 100C, a single color of light can be emitted. Thus, for example, a blue-light source can be provided. For example, when a light source is used to display an image, e.g., for a projector, technologies to exhibit the display color include a technology using an RGB light source and a technology using a combination of a blue-light source and fluorescence emitted by a phosphor. As a form of light-emitting device 100, a provider providing at least the first light-emitting device 100A, the second light-emitting device 100B, and the third light-emitting device 100C can flexibly correspond to such a form of provision according to the request from a customer.

Further, assuming such a form of provision, the curvature of each of the first lens member 80A, the second lens member 80B, and the third lens member 80C preferably corresponds to the blue light. For example, for customers who use the technology of combining a blue light source and fluorescence to exhibit display colors, it is not desirable to design the lens surface based on light of a color other than blue although only blue light is emitted from the light-emitting device 100. The case in which first light is blue has technical significance when such multiple forms of provision are assumed.

Fourth Light-Emitting Device 100D

In the fourth light-emitting device 100D, one or plurality of semiconductor laser elements 20 (hereinafter referred to as fourth semiconductor laser elements 20D) are arranged on the mounting surface 11D of the base 10. A plurality of fourth semiconductor laser elements 20D are sealed in a fourth package. The fourth package forms a sealed space which is an internal space in which the fourth semiconductor laser elements 20D are arranged. The fourth package can be formed by bonding the cover 70 to the base 10.

The fourth package has an outer shape that is the same as that of the second package. When a minimum rectangle enclosing the second package and a minimum rectangle enclosing the fourth package are the same shape in a top view and the second package and the fourth package have the same height, such shapes of the second package and the fourth package can be included in the interpretation of “the second package and the fourth package having the same outer shape.”

The fourth semiconductor laser element 20D is mounted on the submount 30. The fourth semiconductor laser element 20D is mounted on a fourth submount 30D. A submount 30 that is the same as the first submount 30A can be used as a fourth submount 30D on which one fourth semiconductor laser element 20D is to be mounted. In addition, a submount 30 that is the same as the second submount 30B can be used as a fourth submount 30D on which another fourth semiconductor laser element 20D is to be mounted. The fourth semiconductor laser element 20D is arranged on the upper surface of the submount 30, and is mounted on the mounting surface 11D via the submount 30. The fourth semiconductor laser element 20D may be mounted directly to the mounting surface 11D without disposing the submount 30 therebetween. The base 10 may include a protruding portion in place of the submount 30.

In the present specification, in a top view, a direction parallel to the light-emitting surface of the fourth semiconductor laser element 20D is referred to as a seventh direction, and a direction perpendicular to the seventh direction is referred to as an eighth direction. In the third light-emitting device 100C illustrated in the drawings, the seventh direction is the same direction as the X direction, and the eighth direction is the same direction as the Y direction.

Each of the plurality of fourth semiconductor laser elements 20D emits light in the eighth direction. The light of the FFP in which the direction perpendicular to the mounting surface 11D is the fast axis direction is emitted from each of the light-emitting surfaces of the plurality of fourth semiconductor laser elements 20D. In the fourth light-emitting device 100D illustrated in the drawings, the fast axis direction is the same direction as the Z direction.

The plurality of fourth semiconductor laser elements 20D include one or plurality of semiconductor laser elements 20 that emit first light, one or plurality of semiconductor laser elements 20 that emit second light, and one or plurality of semiconductor laser elements 20 that emit third light. Also, the plurality of fourth semiconductor laser elements 20D include a semiconductor laser element 20 that emits red light, a semiconductor laser element that emits green light, and a semiconductor laser element 20 that emits blue light.

In the fourth light-emitting device 100D, the semiconductor laser element 20 that emits first light and the semiconductor laser element 20 that emits second light are mounted on the first submount 30A, and the semiconductor laser element 20 that emits third light is mounted on the second submount 30B.

The quantity of fourth semiconductor laser elements 20D constituting the plurality of fourth semiconductor laser elements 20D in the fourth light-emitting device 100D is the same as the quantity of second semiconductor laser elements 20B constituting the one or more second semiconductor laser elements 20B in the second light-emitting device 100B. The quantity of fourth semiconductor laser elements 20D constituting the plurality of fourth semiconductor laser elements 20D in the fourth light-emitting device 100D is the same as the quantity of third semiconductor laser elements 20C constituting the one or more third semiconductor laser elements 20C in the third light-emitting device 100C.

In the fourth light-emitting device 100D illustrated in the drawings, the plurality of fourth semiconductor laser elements 20D are constituted of one semiconductor laser element 20 that emits first light, one semiconductor laser element 20 that emits second light, and two semiconductor laser element 20 that emit third light.

In the fourth light-emitting device 100D, a protective element 50 protecting the semiconductor laser element 20 that emits first light is mounted on the first stepped portion 12C of the base 10. A protective element 50 protecting the semiconductor laser element 20 that emits second light is mounted on the first stepped portion 12C of the base 10. A protective element 50 protecting the semiconductor laser element 20 that emits third light is mounted on the second stepped portion 12C of the base 10.

In the fourth light-emitting device 100D, one or plurality of reflective members 40 are arranged on the base 10. The reflective member 40 is arranged on the mounting surface 11D. The reflective member 40 includes the light reflective surface. The light emitted from the plurality of fourth semiconductor laser elements 20D is reflected at the one or plurality of light reflective surfaces. The light reflective surface of the reflective member 40 reflects 90% or more of the main portion of the irradiated light.

In the fourth light-emitting device 100D, the fourth semiconductor laser elements 20D are electrically connected to the base 10 by the plurality of wirings 60. Among the plurality of fourth semiconductor laser elements 20D, the semiconductor laser element 20 that emits first light and the semiconductor laser element 20 that emits second light are electrically connected to the wiring pattern 13 provided on the first stepped portion 12C, and the semiconductor laser element 20 that emits third light is electrically connected to the wiring pattern 13 provided on the second stepped portion 12C. The first stepped portion 12C is formed along two inner lateral surfaces 11E that are connected to each other.

Among the plurality of fourth semiconductor laser elements 20D, the semiconductor laser element 20 that emits first light, the semiconductor laser element 20 that emits second light, and the semiconductor laser elements 20 that emit third light are configured to be operated independently from each other.

In the fourth light-emitting device 100D, the cover 70 is bonded to the base 10. The cover 70 is arranged on the upper surface of the base 10. The cover 70 is located higher than the stepped portion 12C. By bonding the cover 70 to the base 10, a closed space surrounded by the base 10 and the cover 70 is generated. This space is a space in which the fourth semiconductor laser elements 20D are arranged.

By bonding the cover 70 to the base 10 under a predetermined atmosphere, a hermetically sealed closed space (sealed space) is created. By hermetically sealing the space in which the semiconductor laser element 20 is disposed, a deterioration in quality due to dust attraction can be reduced. The cover 70 is transmissive of light emitted from the fourth semiconductor laser element 20D. 90% or more of the main portion of the light emitted from the semiconductor laser element 20 passes through the cover 70 and is emitted to the outside.

In the fourth light-emitting device 100D, the lens member 80 is fixed to the fourth package. The lens member 80 is disposed above the cover 70. The lens member 80 is bonded to the cover 70. A fourth lens member 80D is fixed to the fourth package.

The fourth lens member 80D includes the same quantity of lens surfaces as the quantity of fourth semiconductor laser elements 20D constituting the plurality of fourth semiconductor laser elements 20D. Each of the plurality of lens surfaces of the fourth lens member 80D corresponds to a respective one of the plurality of fourth semiconductor laser elements 20D, and light emitted from the fourth semiconductor laser element 20D passes through the corresponding lens surface. The main portions of the lights emitted from respective ones of the fourth semiconductor laser elements 20D pass through lens surfaces different from one another and are emitted from the fourth lens member 80D. The light incident on the fourth lens member 80D becomes collimated light, for example, and is emitted from the fourth lens member 80D.

All of the one or more lens surfaces of the fourth lens member 80D have the same curvature. The lens surfaces of the fourth lens member 80D have the same curvature CX2 in the X direction, the same curvature CY2 in the Y direction, or both the same curvature CX2 in the X direction and the same curvature CY2 in the Y direction. These curvatures of the lens surfaces are determined based on a specific semiconductor laser element 20 to be arranged in the light-emitting device 100. For example, in designing the first light-emitting device 100A, the curvatures of the lens surfaces are determined, on the basis of a position at which the first semiconductor laser element 20A to emit first light is to be arranged, such that a desired optical action is exerted with respect to this semiconductor laser element 20. Also, for example, in designing the fourth light-emitting device 100D, the curvatures of the lens surfaces are determined, on the basis of a position at which the semiconductor laser element 20 to emit first light is to be arranged, such that a desired optical action is exerted with respect to this semiconductor laser element 20.

The positional relationship between the light-emitting surface of the first semiconductor laser element 20 that emits first light in the first light-emitting device 100A and the apex of the lens surface corresponding to this semiconductor laser element 20 is the same as the positional relationship between the light-emitting surface of the semiconductor laser element 20 that emits first light in the fourth light-emitting device 100D and an apex of a lens surface corresponding to this semiconductor laser element 20, but is different from both the positional relationship between the light-emitting surface of the semiconductor laser element 20 that emits second light and an apex of a lens surface corresponding to this semiconductor laser element 20 and the positional relationship between the light-emitting surface of the semiconductor laser element 20 that emits third light in the fourth light-emitting device 100D and an apex of a lens surface corresponding to this semiconductor laser element 20. The lens surfaces of the fourth lens member 80D can have a curvature that collimates first light emitted from the fourth semiconductor laser element 20D.

The curvature of the lens surface of the fourth lens member 80D where first light emitted from the fourth semiconductor laser element 20D passes through is the same as the curvature of the lens surface of the first lens member 80A where first light emitted from the first semiconductor laser element 20A passes through. Also, the curvature of the lens surface of the fourth lens member 80D where light other than first light (i.e., second light or third light) emitted from the fourth semiconductor laser element 20D passes through is the same as the curvature of the lens surface of the first lens member 80A where first light emitted from the first semiconductor laser element 20A passes through.

The curvature of each of the plurality of lens surfaces of the fourth lens member 80D where light emitted from a respective one of the plurality of fourth semiconductor laser elements 20D passes through is the same as a curvature of the lens surface of the first lens member 80A where first light emitted from the first semiconductor laser element 20A passes through. In these lens surfaces, the curvature CX2 and the curvature CX1 in the X direction are the same curvature, the curvature CY2 and the curvature CY1 in the Y direction are the same curvature, or all the curvature CX2, the curvature CX1, the curvature CY2, and the curvature CY1 in the X direction and the Y direction are the same curvature.

The curvature of the lens surface of the fourth lens member 80D where first light emitted from the fourth semiconductor laser element 20D passes through is the same as the curvature of the lens surface of the second lens member 80B where light emitted from the second semiconductor laser element 20B passes through. In these two lens surfaces, the curvature CX2 and the curvature CX1 in the X direction are the same curvature, the curvature CY2 and the curvature CY1 in the Y direction are the same curvature, or all the curvature CX2, the curvature CX1, the curvature CY2, and the curvature CY1 in the X direction and the Y direction are the same curvature.

The fourth lens member 80D can be a lens member that is the same as the second lens member 80B. The fourth light-emitting device 100D has a package similar to that in the second light-emitting device 100B, and includes the fourth semiconductor laser element 20D that emits first light. Even in such a light-emitting device 100, employing substantially the same lens members 80 as the second lens member 80B and the fourth lens member 80D allows for simplifying inventory management of the lens member 80, so that the environmental impact of having a large amount of inventory can be reduced.

The lens portion of the lens member 80 is located at a position closer to one of the outer lateral surfaces 11C, of the two outer lateral surfaces 11C of the base 10 that are located on opposite sides to each other in the direction perpendicular to the coupling direction. In the coupling direction, the lens portion of the lens member 80 is located at a position spaced apart by the same distance from each of the outer lateral surfaces 11C of the base 10 located on opposite sides to each other.

In the third and fourth light-emitting devices 100C and 100D that can employ the same lens members 80, the third light-emitting device 100C can emit light of a single color, and the fourth light-emitting device 100D can emit light of three different colors. Using the same packages and the same lens members 80 allows a provider providing at least the third light-emitting device 100C and the fourth light-emitting device 100D as one form of light-emitting device 100 to provide light-emitting devices 100 corresponding to each of the two technologies described above as a light source for use of displaying images while reducing an environmental load.

Configurations to emit light of three different colors include a configuration having a combination of the first light-emitting device 100A and the second light-emitting device 100B, and a configuration having the fourth light-emitting device 100D. A provider providing at least the first light-emitting device 100A, the second light-emitting device 100B, and the fourth light-emitting device 100D can provide an appropriate configuration of the light-emitting device 100 according to an optical output requested from a customer.

Fifth Light-Emitting Device 100E

In the fifth light-emitting device 100E, a plurality of semiconductor laser elements 20 (hereinafter referred to as fifth semiconductor laser elements 20E) are arranged on the mounting surface 11D of the base 10. The plurality of fifth semiconductor laser elements 20E are sealed in a fifth package. The fifth package forms a sealed space which is an internal space in which the fifth semiconductor laser elements 20E are arranged. The fifth package can be formed by bonding the cover 70 to the base 10.

The fifth package has an outer shape that is the same as that of the first package. Alternatively, the fifth package may be a package that is the same as the third package. When a minimum rectangle enclosing the fifth package and a minimum rectangle enclosing the first package are the same shape in a top view and the fifth package and the first package have the same height, such shapes of the fifth package and the first package can be included in the interpretation of "the fifth package and the first package having the same outer shape."

The fifth semiconductor laser element 20E is mounted on the submount 30. The fifth semiconductor laser element 20E is mounted on a fifth submount 30E. The fifth submount 30E is a submount 30 that is the same as the first submount 30A.

In other words, in the fifth light-emitting device 100E, the semiconductor laser element 20 can be mounted using a submount 30 that is the same as the submount 30 used in the first light-emitting device 100A. The fifth semiconductor laser element 20E are arranged on the upper surface of the submount 30, and is mounted on the mounting surface 11D via the submount 30. The fifth semiconductor laser element 20E may be mounted directly to the mounting surface 11D without disposing the submount 30 therebetween. The base 10 may include a protruding portion in place of the submount 30.

Each of the plurality of fifth semiconductor laser elements 20E is arranged on a respective one of different fifth submounts 30E that are different from each other. A single fifth semiconductor laser element 20E is arranged on a single fifth submount 30E. A plurality of fifth semiconductor laser elements 20E may be arranged on a single submount 30.

In the present specification, in a top view, a direction parallel to the light-emitting surface of the fifth semiconductor laser element 20E is referred to as a ninth direction, and a direction perpendicular to the ninth direction is referred to as a tenth direction. In the fifth light-emitting device 100E illustrated in the drawings, the ninth direction is the same direction as the X direction, and the tenth direction is the same direction as the Y direction.

Each of the plurality of fifth semiconductor laser elements 20E emits light in the tenth direction. The light of the FFP in which the direction perpendicular to the mounting surface 11D is the fast axis direction is emitted from each of the light-emitting surfaces of the plurality of fifth semiconductor laser elements 20E. In the fifth light-emitting device 100E illustrated in the drawings, the fast axis direction is the same direction as the Z direction.

The plurality of fifth semiconductor laser elements 20E include one or plurality of semiconductor laser elements 20 that emit first light. All the one or plurality of fifth semiconductor laser elements 20E can be semiconductor laser elements 20 that emit first light.

The quantity of fifth semiconductor laser elements 20E constituting the plurality of fifth semiconductor laser elements 20E in the fifth light-emitting device 100E is greater than the quantity of third semiconductor laser elements 20C constituting the one or more third semiconductor laser elements 20C in the third light-emitting device 100C. The quantity of fifth semiconductor laser elements 20E constituting the plurality of fifth semiconductor laser elements 20E in the fifth light-emitting device 100E is the same as the quantity of first semiconductor laser elements 20A constituting the plurality of first semiconductor laser elements 20A in the first light-emitting device 100A.

In the fifth light-emitting device 100E, the protective element 50 is mounted on the submount 30. The protective element 50 is arranged on the submount 30 on which the fifth semiconductor laser element 20E is arranged. The one or plurality of protective elements 50 are arranged on the fifth submounts 30E different from each other.

In the fifth light-emitting device 100E, the one or plurality of reflective members 40 are arranged on the base 10. The reflective member 40 is arranged on the mounting surface 11D. The reflective member 40 includes the light reflective surface. Light emitted from the one or plurality of fifth semiconductor laser elements 20E is reflected at the one or plurality of light reflective surfaces. The light reflective surface of the reflective member 40 reflects 90% or more of the main portion of the irradiated light.

In the fifth light-emitting device 100E, the fifth semiconductor laser elements 20E are electrically connected to the base 10 by the plurality of wirings 60. The plurality of fifth semiconductor laser elements 20E are electrically connected to the wiring pattern 13 provided on the first stepped portion 12C and the wiring pattern 13 provided on the second stepped portion 12C.

In the fifth light-emitting device 100E, the cover 70 is bonded to the base 10. The cover 70 is arranged on the upper surface of the base 10. The cover 70 is located higher than the stepped portion 12C. By bonding the cover 70 to the base 10, a closed space surrounded by the base 10 and the cover 70 is generated. This space is a space in which the fifth semiconductor laser elements 20E are arranged.

By bonding the cover 70 to the base 10 under a predetermined atmosphere, a hermetically sealed closed space (sealed space) is created. By hermetically sealing the space in which the semiconductor laser element 20 is disposed, a deterioration in quality due to dust attraction can be reduced. The cover 70 is transmissive of light emitted from the fifth semiconductor laser element 20E. 90% or more of the main portion of the light emitted from the semiconductor laser element 20 passes through the cover 70 and is emitted to the outside.

In the fifth light-emitting device 100E, the lens member 80 is fixed to the fifth package. The lens member 80 is disposed above the cover 70. The lens member 80 is bonded to the cover 70. A fifth lens member 80E is fixed to the fifth package.

The fifth lens member 80E includes the same quantity of lens surfaces as the quantity of fifth semiconductor laser elements 20E constituting the plurality of fifth semiconductor laser elements 20E. Each of the plurality of lens surfaces of the fifth lens member 80E corresponds to a respective one of the plurality of fifth semiconductor laser elements 20E, and light emitted from the fifth semiconductor laser element 20E passes through the corresponding lens surface. The main portions of the lights emitted from respective ones of the fifth semiconductor laser elements 20E pass through lens surfaces different from one another and are emitted from the fifth lens member 80E. The light incident on the fifth lens member 80E becomes collimated light, for example, and is emitted from the fifth lens member 80E.

The one or more lens surfaces of the fifth lens member 80E have the same curvature. The lens surfaces of the fifth lens member 80E have the same curvature CX1 in the X direction, the same curvature CY1 in the Y direction, or both the same curvature CX1 in the X direction and the same curvature CY1 in the Y direction. The curvature of these lens surfaces are determined based on a specific semiconductor laser element 20 arranged in the light-emitting device 100. For example, in designing the fifth light-emitting device 100E, the curvature of the lens surfaces is determined, on the basis of a position at which the semiconductor laser element 20 to emit first light is to be arranged, such that a desired optical action is exerted with respect to this semiconductor laser element 20. Also, for example, in designing the third light-emitting device 100C, the curvature of the lens surface(s) is determined, on the basis of a position at which the semiconductor laser element 20 to emit first light is to be arranged, such that a desired optical action is exerted with respect to this semiconductor laser element 20.

The positional relationship between the light-emitting surface of the third semiconductor laser element 20 that emits first light in the third light-emitting device 100C and an apex of the lens surface corresponding to this semiconductor laser element 20 and the positional relationship between the light-emitting surface of the semiconductor laser element 20 that emits first light in the fifth light-emitting device 100E and an apex of the lens surface corresponding to this semiconductor laser element 20 are the same. The lens surfaces of the fifth lens member 80E can have a curvature that collimates first light emitted from the fifth semiconductor laser element 20E.

The curvature of the lens surface of the fifth lens member 80E where first light emitted from the fifth semiconductor laser element 20E passes through is the same as the curvature of the lens surface of the first lens member 80A where light emitted from the first semiconductor laser element 20A other than first light (i.e., second light) passes through. These two lens surfaces have the same curvature CX1 in the X direction, the same curvature CY1 in the Y direction, or both the same curvature CX1 in the X direction and the same curvature CY1 in the Y direction.

The curvature of the lens surface of the fifth lens member 80E where first light emitted from the fifth semiconductor laser element 20E passes through is the same as the curvature of the lens surface of the second lens member 80B where light emitted from the second semiconductor laser element 20B passes through. In these two lens surfaces, the curvature CX1 and the curvature CX2 in the X direction are the same curvature, the curvature CY1 and the curvature CY2 in the Y direction are the same curvature, or all the curvature CX1, the curvature CX2, the curvature CY1, and the curvature CY2 in the X direction and the Y direction are the same curvature.

The fifth lens member 80E can be a lens member 80 that is the same as the first lens member 80A. The fifth light-emitting device 100E has a package similar to that in the first light-emitting device 100A, and includes the fifth semiconductor laser element 20E that emits first light. Even in such a light-emitting device 100, employing substantially the same lens members 80 as the first lens member 80A and the fifth lens member 80E allows for simplifying inventory management of the lens member 80, so that the environmental impact of having a large amount of inventory can be reduced.

In the fifth light-emitting device 100E, a package that is the same as or similar to the package of the third light-emitting device 100C is included, and the quantity of the semiconductor laser elements 20 that emit first light is greater than that in the third light-emitting device 100C. Providing the third lens member 80C and the fifth lens member 80E with the same curvature and different quantity of lens surfaces allows for facilitating provision of light-emitting devices 100 that emit light of the same color and different amounts of light.

The lens portion of the lens member 80 is located at a position closer to one of the outer lateral surfaces 11C, of the two outer lateral surfaces 11C of the base 10 that are located on opposite sides to each other in the direction perpendicular to the coupling direction. In the coupling direction, the lens portion of the lens member 80 is located at a position spaced apart by the same distance from each of the outer lateral surfaces 11C of the base 10 located on opposite sides to each other.

When the first light-emitting device 100A and the second light-emitting device 100B are combined, three different colors of light can be emitted. Accordingly, an RGB light source can be provided. Further, by providing the fifth light-emitting device 100E, a single color of light can be emitted. A provider providing at least the first light-emitting device 100A, the second light-emitting device 100B, and the fifth light-emitting device 100E as forms of light-emitting device 100 can flexibly correspond to such a form of provision according to a request from a customer.

Light-Emitting Module 200

In a light-emitting module 200, a plurality of light-emitting devices 100 are mounted on the wiring substrate 9. One light-emitting device 100 is connected to the first connection pattern 9A1, and another light-emitting device 100 is connected to the second connection pattern 9A2. For example, the first light-emitting device 100A and the second light-emitting device 100B can be employed as these two light-emitting devices 100.

Further, the provider of the light-emitting module 200 in which the first light-emitting device 100A and the second light-emitting device 100B are mounted on the wiring substrate 9 can be a provider who manufactures and/or transfers it to a third party a light-emitting module in which two third light-emitting device 100C are mounted on the wiring substrate. Alternatively, this provider may be a provider who manufactures and/or transfers to a third party the light-emitting module in which two fifth light-emitting devices 100E are mounted on the wiring substrate. Alternatively, this provider may be a provider who manufactures and/or transfers to a third party a light-emitting module in which the third light-emitting device 100C and the fifth light-emitting device 100E are mounted on a wiring substrate.

In the light-emitting module 200, these two light-emitting devices 100 are aligned in the same direction and arranged on the wiring substrate 9. These two light-emitting devices 100 are arranged to be aligned such that the lens portions of the lens 80 are at locations shifted in the same direction. In the light-emitting module 200, these two light-emitting devices 100 may be arranged such that one of the two light-emitting devices 100 is oriented with a rotation of 180 degrees with respect to the other of the two light-emitting devices 100 in a top view.

While certain embodiments of the present invention has been described above, the present invention is not strictly limited to the light-emitting devices and the light-emitting modules according to the embodiments described above. In other words, for implementing the present invention, it is not necessary to limit an outer shape and a structure of the light-emitting device and light-emitting module to those disclosed in the embodiments described above. The present invention can be applied without requiring provision of all the components of the light-emitting device or light-emitting module described in the embodiment in a necessary and sufficient manner. For example, if the claims do not recite some of the components of a light-emitting device or light-emitting module disclosed in the embodiment, freedom of design by a person skilled in the art, such as omission, change in shape, and change of material for such components is allowed, and then the invention stated in the scope of the claims being applied to those components is specified.

The light-emitting device and the light-emitting module described in the embodiments described above can be used for a projector, a vehicle headlight, a head mounted display, a lighting device, a display, etc.

What is claimed is:

1. A plurality of light-emitting devices adapted to be transferred to one customer or transferred separately to different customers, the plurality of light-emitting devices comprising:

a first light-emitting device including
 a first package having a first outer shape,
 a plurality of first semiconductor laser elements sealed in the first package, and
 a first lens member fixed to the first package and having a plurality of lens surfaces, a number of the lens surfaces of the first lens member being the same as the number of the first semiconductor laser elements, each of the lens surfaces corresponding to a respective one of the first semiconductor laser elements and being configured to transmit light emitted from the respective one of the first semiconductor laser elements, and a second light-emitting device including a second package having the first outer shape, one or more second semiconductor laser elements sealed in the second package, and a second lens member fixed to the second package and having one or more lens surfaces, a number of the one or more lens surfaces of the second lens member being the same as the number of the one or more second semiconductor laser elements, each of the one or more lens surfaces corresponding to a respective one of the one or more second semiconductor laser elements and being configured to transmit light emitted from the respective one of the one or more second semiconductor laser elements, wherein a number of the one or more second semiconductor laser elements is less than a number of the first semiconductor laser elements, one of the first semiconductor laser elements is configured to emit first light having a color different from a color of light emitted from any of the one or more second semiconductor laser elements, and a curvature of one of the lens surfaces of the first lens member configured to transmit the first light emitted from the one of the first semiconductor laser elements is the same as a curvature of one of the one or more lens surfaces of the second lens member.

2. The plurality of light-emitting devices according to claim 1, wherein the first semiconductor laser elements are constituted of five semiconductor laser elements, the one or more second semiconductor laser elements is constituted by four semiconductor laser elements, one of the first semiconductor laser elements is configured to emit second light having a color different from the color of the first light, one of the one or more second semiconductor laser elements is configured to emit third light having a color different from the color of the first light and the color of the second light, and all of the lens surfaces of the first lens member have the same curvature.

3. The plurality of light-emitting devices according to claim 1, wherein the lens surfaces of the first lens member are aligned and coupled to each other, the one or more lens surfaces of the second lens member are aligned and coupled to each other, and a width of each of the lens surfaces of the first lens member in a direction in which the lens surfaces of the first lens member are aligned is smaller than a width of each of the one or more lens surfaces of the second lens member in a direction in which the one or more lens surfaces of the second lens member are aligned.

4. The plurality of light-emitting devices according to claim 3, wherein all of the lens surfaces of the first lens member have the same curvature, and all of the one or more lens surfaces of the second lens member have the same curvature.

5. The plurality of light-emitting devices according to claim 1, further comprising a third light-emitting device including a third package having the first outer shape, one or more third semiconductor laser elements sealed in the third package, and a third lens member fixed to the third package and having one or more lens surfaces, each of the one or more lens surfaces corresponding to a respective one of the one or more third semiconductor laser elements and being configured to transmit light emitted from the respective one of the one or more third semiconductor laser elements, wherein a number of the one or more third semiconductor laser elements is the same as the number of the one or more second semiconductor laser elements, all of the one or more third semiconductor laser elements are configured to emit light having the same color as the first light, and a curvature of each of the one or more lens surfaces is the same as a curvature of one of the one or more lens surfaces of the second lens member.

6. The plurality of light-emitting devices according to claim 5, wherein the color of the first light is blue.

7. The plurality of light-emitting devices according to claim 6, wherein each of the one or more lens surfaces of the third lens member has a curvature that allows for collimating the light emitted from a corresponding one of the one or more third semiconductor laser elements.

8. The plurality of light-emitting devices according to claim 5, wherein all of the one or more lens surfaces of the third lens member have the same curvature.

9. The plurality of light-emitting devices according to claim 5, wherein the second package and the third package are identical.

10. The plurality of light-emitting devices according to claim 5, further comprising a fourth light-emitting device including a fourth package having the first outer shape, one or more fourth semiconductor laser elements sealed in the fourth package, and a fourth lens member fixed to the fourth package and having one or more lens surfaces, each of the one or more lens surfaces corresponding to a respective one of the one or more fourth semiconductor laser elements and being configured to transmit light emitted from the respective one of the one or more fourth semiconductor laser elements, wherein a number of the fourth semiconductor laser elements is the same as the number of the one or more second semiconductor laser elements, the fourth semiconductor laser elements include a semiconductor laser element configured to emit red light, a semiconductor laser element configured to emit green light, and a semiconductor laser element configured to emit blue light, and a curvature of each of the one or more lens surfaces of the fourth lens member configured to transmit the light emitted from a respective one of the fourth semiconductor laser elements is the same as the curvature of one of the lens surfaces of the first lens member configured to transmit the first light emitted from the first semiconductor laser element.

11. A light-emitting module comprising:

a first light-emitting device including a first package having a first outer shape, a plurality of first semiconductor laser elements sealed in the first package, and a first lens member fixed to the first package and having a plurality of lens surfaces, a number of the lens surfaces of the first lens member being the same as the number of the first semiconductor laser elements, each of the lens surfaces corresponding to a respective one of the first semiconductor laser elements and being configured to transmit light emitted from the respective one of the first semiconductor laser elements;

a second light-emitting device including a second package having the first outer shape, one or more second semiconductor laser elements sealed in the second package, and a second lens member fixed to the second package and having one or more lens surfaces, a number of the one or more lens surfaces of the second lens member being the same as the number of the one or more second semiconductor laser elements, each of the one or more lens surfaces corresponding to a respective one of the one or more second semiconductor laser elements and being configured to transmit light emitted from the respective one of the one or more second semiconductor laser elements; and a wiring substrate on which the first light-emitting device and the second light-emitting device are mounted, wherein a number of the one or more second semiconductor laser elements is less than a number of the first semiconductor laser elements, one of the first semiconductor laser elements is configured to emit light of a color different from a color of light emitted from any of the one or more second semiconductor laser elements, and a curvature of one of the lens surfaces of the first lens member configured to transmit the light emitted from the one of the first semiconductor laser elements is the same as a curvature of one of the one or more lens surfaces of the second lens member.

* * * * *